United States Patent
Tanaka

(10) Patent No.: US 8,035,463 B2
(45) Date of Patent: Oct. 11, 2011

(54) LAMB-WAVE RESONATOR AND OSCILLATOR

(75) Inventor: Satoru Tanaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 344 days.

(21) Appl. No.: 12/396,013

(22) Filed: Mar. 2, 2009

(65) Prior Publication Data

US 2009/0231061 A1    Sep. 17, 2009

(30) Foreign Application Priority Data

Mar. 12, 2008 (JP) ................... 2008-062234
Nov. 7, 2008 (JP) ................... 2008-286219

(51) Int. Cl.
*H03H 9/15* (2006.01)
*H03H 9/19* (2006.01)
*H03H 9/54* (2006.01)

(52) U.S. Cl. ............ 333/187; 310/361; 310/313 A; 310/313 D; 333/195

(58) Field of Classification Search .......... 333/187, 333/193–196; 310/313 R, 360, 361
See application file for complete search history.

(56) References Cited

U.S. PATENT DOCUMENTS

| | | | |
|---|---|---|---|
| 6,005,326 A | | 12/1999 | Yoshimoto et al. |
| 6,040,651 A | | 3/2000 | Yoshimoto et al. |
| 7,327,070 B2 | * | 2/2008 | Tanaka ............. 310/313 A |
| 2006/0152107 A1 | * | 7/2006 | Tanaka ............. 310/313 R |
| 2006/0255884 A1 | * | 11/2006 | Tanaka ............. 333/195 |
| 2007/0188047 A1 | * | 8/2007 | Tanaka ............. 310/313 D |

FOREIGN PATENT DOCUMENTS

JP    09-275326    * 10/1997

(Continued)

OTHER PUBLICATIONS

V. Yantchev et al.; "Design and Fabrication of Thin Film Lamb Wave Resonators Utilizing Longitudinal Wave and Interdigital Transducers"; 2005 IEEE Ultrasonics Symposium, vol. 3, pp. 1580-1583, Sep. 18-21, 2005.*

(Continued)

*Primary Examiner* — Barbara Summons
(74) *Attorney, Agent, or Firm* — Oliff & Berridge, PLC

(57) ABSTRACT

A Lamb-wave resonator includes: a piezoelectric substrate; an interdigital transducer electrode formed on a main surface of the piezoelectric substrate, the interdigital transducer electrode including a plurality of electrode finger elements being interdigitated, and a bus bar electrode coupling the plurality of electrode finger elements; and a pair of reflectors disposed on opposite sides of the interdigital transducer electrode in a propagation direction of a Lamb wave. A thickness t of the piezoelectric substrate is in a range expressed by $0 < t/\lambda \leq 3$ where a wavelength of the Lamb wave to be excited is represented as $\lambda$. If a width of the bus bar electrode is Wb, a distance from the electrode finger elements to the bus bar electrode is Wg, in an orthogonal coordinate with an x axis indicating the distance Wg and a y axis indicating the width Wb, both the distance Wg and the width Wb are in one of a first range and a second range. The first range is surrounded by a circular arc expressed by an equation of a circle $(x-10)^2 + (y+12.7)^2 = 19^2$, and $Wg \geq 1\lambda$ and $Wb \geq 1\lambda$, and the second range is surrounded by a straight line connecting coordinates of (1.0, 7.0), (1.0, 20.0), (2.0, 21.0), (4.5, 22.5), (7.5, 25.0), (12.0, 23.0), (15.5, 20.8), (18.0, 14.0), (20.0, 7.0), (16.0, 10.0), (15.0, 9.0), (12.5, 8.0), (10.0, 8.0), (8.0, 9.0), (7.0, 8.0), (5.0, 8.0), (3.5, 10.0), (2.0, 10.0), (1.0, 7.0) in this order if the coordinates are represented as (Wg, Wb).

3 Claims, 35 Drawing Sheets

FOREIGN PATENT DOCUMENTS

| | | |
|---|---|---|
| JP | A-10-126211 | 5/1998 |
| JP | A-2003-188676 | 7/2003 |
| JP | A-2003-258596 | 9/2003 |
| JP | A-2008-54163 | 3/2008 |

OTHER PUBLICATIONS

J. Bjurstrom et al.; "Lateral-Field-Excited Thin-Film Lamb Wave Resonator"; Applied Physics Letters 86, Apr. 5, 2005, pp. 154103-1 to 154103-3.*

Ultrasound Handbook Editorial Committee; *Choonpa Binran (Ultrasound Handbook)*; 1999; pp. 62-71.

150th Committee of the Nippon Academy Promotion Association Acoustic Wave Element Technique; Acoustic Wave Element Technical Handbook; 1991; pp. 148-158.

Nakagawa et al; Temperature Characteristics of the Substrate for Lamb Wave Type Elastic Wave Devices; IEICE Transactions On Electronics; 2006; pp. 34-39; vol. J-89C, No. 1.

* cited by examiner

LAMB-WAVE RESONATOR AND OSCILLATOR

BACKGROUND

1. Technical Field

The present invention relates to a Lamb-wave resonator using a Lamb wave and an oscillator including the Lamb-wave resonator.

2. Related Art

A Lamb wave is a plate wave, which is a bulk wave propagating inside a substrate by repeating reflections between upper and lower surfaces of the substrate when a thickness of the substrate is reduced to less than or equal to a few wavelengths of the wave to be propagated. Surface waves such as Rayleigh waves, leaky surface acoustic waves, and pseudo-longitudinal wave type leaky surface acoustic waves have 90% of energy within a depth of one wavelength from a surface of a substrate. However, unlike such surface waves, since the Lamb wave is a bulk wave propagating inside the substrate, its energy is distributed to a whole of the substrate. According to *Choonpa Binran (Ultrasound Handbook)*, edited by Ultrasound Handbook Editorial Committee and issued by Maruzen Kabushiki Kaisha in 1999, pp. 62 to 71, plate waves and Rayleigh waves are scholarly distinguished. Further, in *Acoustic wave element technical handbook*, edited by the 150th committee of the Nippon Academy Promotion Association Acoustic Wave Element Technique and issued by Ohm-sha in 1991, pp. 148 to 158, a method for analyzing Rayleigh waves and leaky surface acoustic waves is described. Furthermore, *Temperature characteristics of the substrate for lamb wave type elastic wave devices* by Yasuhiko Nakagawa, Mitsuyoshi Shigeda, Kazumasa Shibata, and Shouji Kakio, IEICE Transactions on Electronics J-89C No. 1, pp. 34 to 39, a method for analyzing Lamb waves is described. As big differences between the waves, selection methods for a solution of an eighth equation are different, and Rayleigh waves and Lamb waves are completely different waves having different properties. Therefore, Lamb waves cannot provide favorable characteristics with same design conditions as those of Rayleigh waves. A design method specified for Lamb waves is thus required.

Further, as a characteristic of Lamb waves, similarly to a dispersion curve shown in JP-A-2003-258596, a mode that can propagate Lamb waves is a mode in which a wave number in a thickness direction of a substrate satisfies resonance conditions. Lamb waves have many modes including a high order. A phase velocity of existing modes of Lamb waves is larger than that of Rayleigh waves. Since many modes of them have a phase velocity that is larger or equal to that of "longitudinal wave", a mode having a larger phase velocity can easily provide a high frequency even when a line width is the same as that of the surface wave described above. Further, an AT cut quartz substrate having a thickness of 5 wavelengths or less is employed, making it possible to use Lamb waves having an excellent temperature characteristic and being suitable for using a high frequency.

Furthermore, a Lamb-wave type high frequency resonator having an interdigital transducer (IDT) electrode including a first interdigital electrode and a second interdigital electrode that are interdigitated to each other on a main surface of a piezoelectric substrate and set to satisfy $21\lambda \leq W \leq 54\lambda$, where a cross width of the first interdigital electrode and the second interdigital electrode is W, and a wavelength of the Lamb wave is $\lambda$ has been proposed (e.g. JP-A-2008-54163).

According to JP-A-2003-258596 described above, metal having a higher specific gravity is used as an electrode so as to increase a reflection coefficient of Lamb waves, thereby enabling energy trapping with less number of reflectors and achieving size reduction. This means that energy trapping is achieved by suppressing a vibration leakage in a lengthwise direction (a propagation direction of Lamb waves). However, it is hard to say that this electrode design is always optimum because energy trapping in a widthwise direction (a direction perpendicular to the propagation direction of Lamb waves) is not considered. Further, JP-A-2008-54163 does not disclose a specific method to increase energy trapping in the widthwise direction, either.

If a vibration leakage from an outer edge of a bus bar electrode toward a laterally outer edge of a piezoelectric substrate occurs, a spurious is caused by a reflection wave from the outer edge of the piezoelectric substrate.

SUMMARY

An advantage of the invention is to provide a Lamb-wave resonator, and an oscillator including the Lamb-wave resonator that can solve at least part of the above-mentioned problems and can be achieved according to the following aspects.

According to an aspect of the invention, a Lamb-wave resonator includes: a piezoelectric substrate; an interdigital transducer electrode formed on a main surface of the piezoelectric substrate, the interdigital transducer electrode including a plurality of electrode finger elements being interdigitated, and a bus bar electrode coupling the plurality of electrode finger elements; and a pair of reflectors disposed on opposite sides of the interdigital transducer electrode in a propagation direction of a Lamb wave. A thickness t of the piezoelectric substrate is in a range expressed by $0 < t/\lambda \leq 3$ where a wavelength of the Lamb wave to be excited is represented as $\lambda$. If a width of the bus bar electrode is Wb, a distance from the electrode finger elements to the bus bar electrode is Wg, in an orthogonal coordinate with an x axis indicating the distance Wg and a y axis indicating the width Wb, both the distance Wg and the width Wb are in one of a first range and a second range. The first range is surrounded by a circular arc expressed by an equation of a circle $(x-10)^2+(y+12.7)^2=19^2$, and $Wg \geq 1\lambda$ and $Wb \geq 1\lambda$, and the second range is surrounded by a straight line connecting coordinates of (1.0, 7.0), (1.0, 20.0), (2.0, 21.0), (4.5, 22.5), (7.5, 25.0), (12.0, 23.0), (15.5, 20.8), (18.0, 14.0), (20.0, 7.0), (16.0, 10.0), (15.0, 9.0), (12.5, 8.0), (10.0, 8.0), (8.0, 9.0), (7.0, 8.0), (5.0, 8.0), (3.5, 10.0), (2.0, 10.0), and (1.0, 7.0) in this order if the coordinates are represented as (Wg, Wb).

According to the aspect above, on a free surface from an outer edge of the bus bar electrode and an outer edge of the piezoelectric substrate (only a region of a quartz substrate without electrodes), a displacement orthogonal to the propagation direction of the Lamb wave in the widthwise direction converges. This is a state in which a vibration leakage hardly occurs at an outer side from the bus bar electrode, that is, a state in which energy is trapped. Therefore, suppressing the vibration leakage in the widthwise direction can dramatically reduce amplitude of a reflection wave occurring at the outer edge of the piezoelectric substrate in the widthwise direction, Therefore, a spurious caused by the reflection wave from the outer edge of the piezoelectric substrate in the widthwise direction can be reduced.

Further, this can suppress a decrease of a Q value and an increase of a CI value. The Q value and the CI value are major factors for evaluating resonance characteristics of the Lamb-wave resonator. Therefore, with a high Q value, resonance of the Lamb-wave resonator can be stably maintained, while with a low CI value, power consumption reduction can be realized.

In the Lamb-wave resonator, a cross width of the plurality of electrode finger elements that are interdigitated to each other is preferably 20λ or more.

In a case where the Lamb-wave resonator is employed to an oscillator, the Lamb-wave resonator satisfies oscillation conditions when assembled with an oscillation circuit. However, according to a measurement result of an admittance circle diagram in the vicinity of a resonance frequency to be described later, when the cross width Wi is 20λ or more, the admittance B is B<0 and inductive, providing a stable oscillation when the Lamb-wave resonator and the oscillation circuit are assembled.

In the Lamb-wave resonator, the piezoelectric substrate is preferably a quartz substrate with an Euler angle ($\phi$, $\theta$, $\psi$) satisfying $\phi=0$ degrees, 35 degrees$\leq\theta\leq$47.2 degrees, and −5 degrees$<\psi<$+5 degrees, and a relation between the thickness t and the wavelength λ of the Lamb wave satisfies $0.1765\leq t/\lambda\leq 1.925$.

A frequency temperature characteristic, a frequency band, and excitation stability of Lamb-wave resonators are controlled by a cutout angel of a quartz substrate and a propagation direction of an acoustic wave, that is, controlled by the standardized substrate thickness t/λ that is represented as a relation of the angle θ of the Euler angle (0, θ, 0), the substrate thickness t, and the wavelength λ.

In a case satisfying the equations described above, the Lamb-wave resonator can obtain a frequency temperature characteristic superior to those of STW cut quartz crystal and ST cut quartz crystal in related art described above and become applicable to a high frequency band. Further, the electromechanical coupling coefficient ($K^2$) representing excitation efficiency of the quartz substrate can be improved. As a result, the Lamb-wave resonator that can be easily excited and has a stable frequency temperature characteristic can be provided.

According to another aspect of the invention, an oscillator includes the Lamb-wave resonator above, and an oscillation circuit for exciting the Lamb-wave resonator.

According to the second aspect, the Lamb-wave resonator formed under optimum electrode design conditions and having the cross width Wi of 20λ or more is employed as well as a quartz substrate as a piezoelectric substrate, providing the oscillator having a high Q value, a low CI value, and an excellent frequency temperature characteristic while suppressing a vibration leakage.

BRIEF DESCRIPTION OF THE DRAWINGS

The invention will be described with reference to the accompanying drawings, wherein like numbers reference like elements.

FIG. 2A is a perspective view schematically showing a configuration thereof while FIG. 2B is a cross-sectional view taken along the line A-A in FIG. 2A.

DESCRIPTION OF EXEMPLARY EMBODIMENTS

Figure 71:
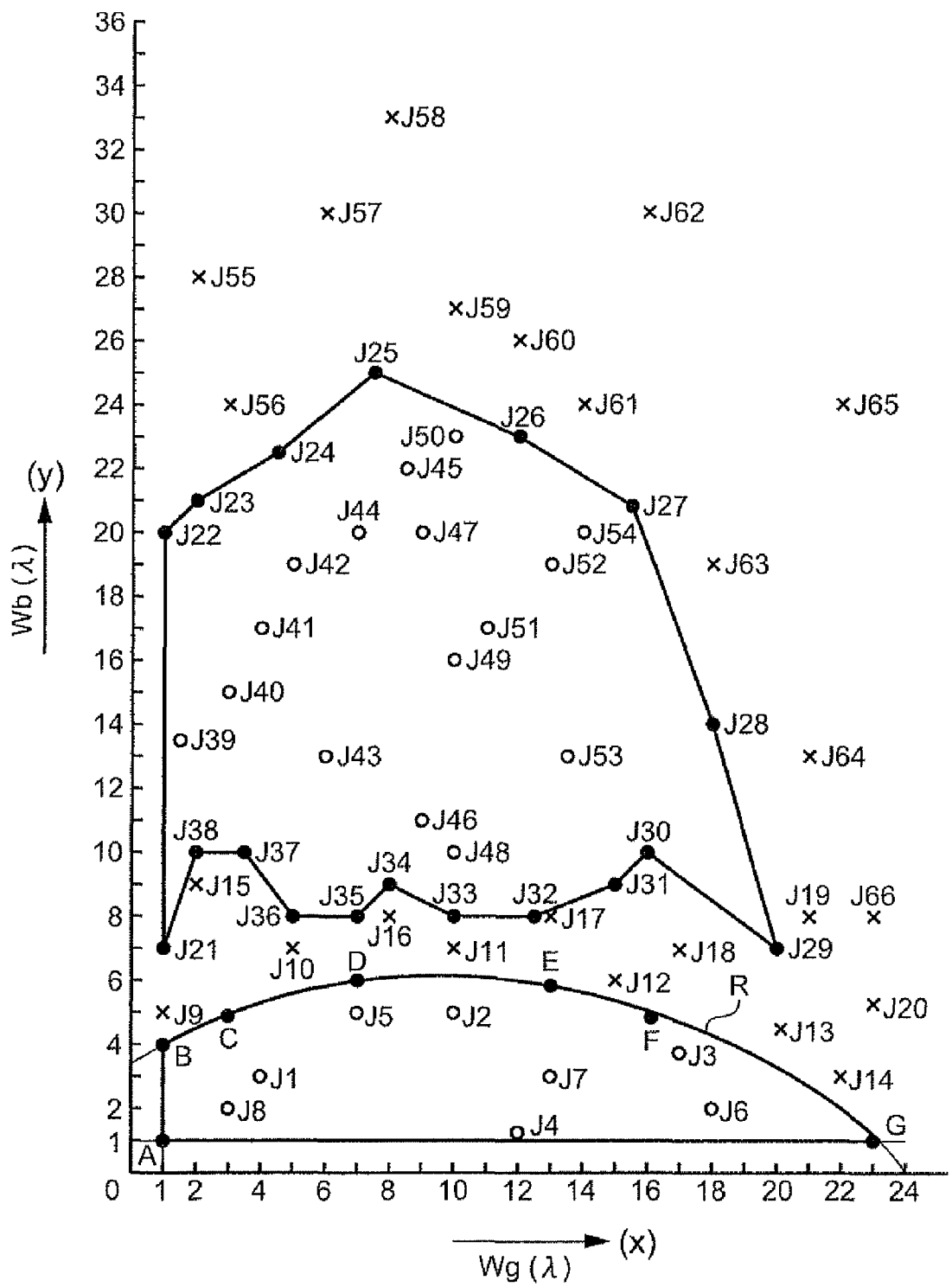
FIG. 71 is an explanatory diagram showing if displacements in a widthwise direction according to combinations of parameters of IDT electrodes according to Examples 1 to 66 converge or not.

Embodiments of the invention will now be described with reference to the accompanying drawings.
FIGS. 1 to 4 show a Lamb-wave resonator according to a first embodiment. FIGS. 5 to 71 show Examples 1 to 66 that are specific working examples. FIGS. 72 to 79 show temperature characteristics, and FIG. 80 shows an admittance circle diagram in the vicinity of a resonance frequency.
Further, note that the drawings referred in description hereinafter are shown with different scales in horizontal and vertical directions for members and parts from the ones for actual members and parts in order to make the drawings simple.

First Embodiment

Figure 1:
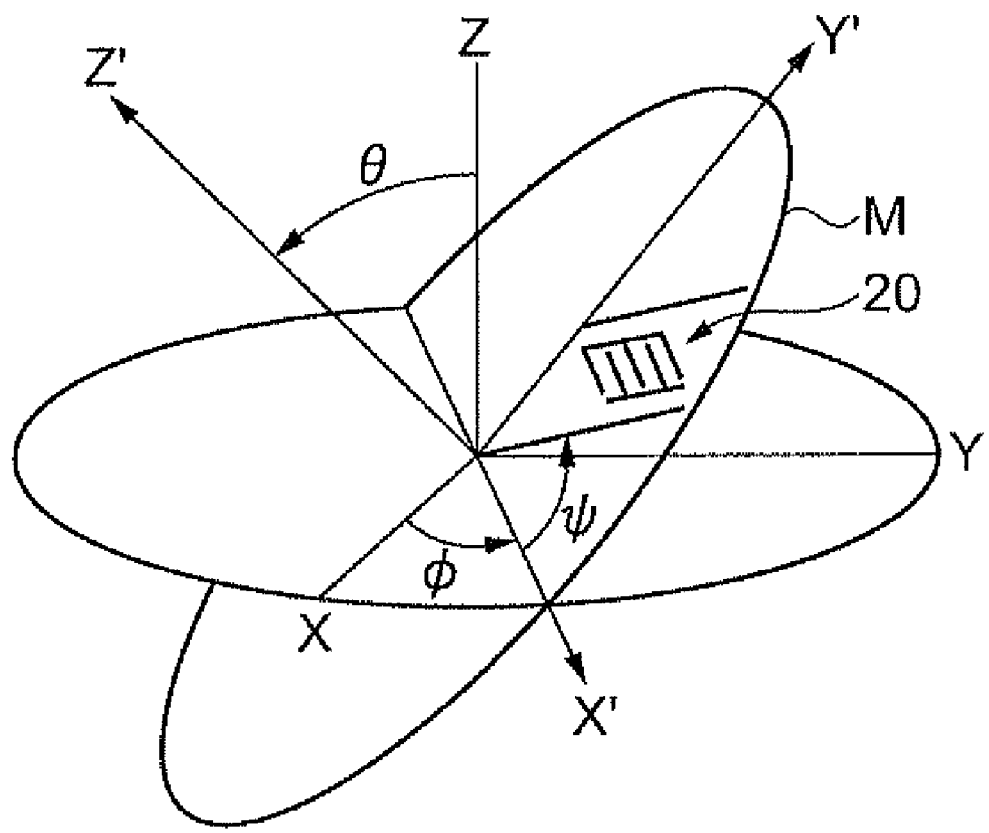
FIG. 1 is a diagram showing a direction to cut out a quartz substrate according to a first embodiment.

FIG. 1 is an explanatory diagram showing a cutout direction of a quartz substrate and a propagation direction of a Lamb wave, that is, an explanatory diagram of Euler angle ($\phi$, $\theta$, $\psi$), according to a first embodiment. A quartz substrate 10 serving as a piezoelectric substrate is defined by an X axis called an electrical axis, a Y axis called a mechanical axis, and a Z axis called an optical axis.
A substrate expressed by Euler angle (0°, 0°, 0°) is a Z-cut substrate having a main surface perpendicular to the Z axis. In the Euler angle here, $\phi$ relates to a first rotation of the Z-cut substrate, and represents a first rotation angle when the Z axis is a rotation axis and a direction to rotate from +X axis to +Y axis is a positive rotation angle.
Further, $\theta$ of the Euler angle relates to a second rotation performed after the first rotation of the Z-cut substrate, and represents a second rotation angle when the X axis after the first rotation is the rotation axis and a direction to rotate from +Y axis after the first rotation to +Z axis is a positive rotation angle. A cut surface of the quartz substrate 10 is determined based on the first rotation angle $\phi$ and the second rotation angle $\theta$.

Further, ψ of the Euler angle relates to a third rotation performed after the second rotation of the Z-cut substrate, and represents a third rotation angle when the Z axis after the second rotation is the rotation axis and a direction to rotate from +X axis after the second rotation to +Y axis after the second rotation is a positive rotation angle. The propagation direction of the Lamb wave is represented by the third rotation angle ψ with respect to the X axis after the second rotation.

Figure 2A:
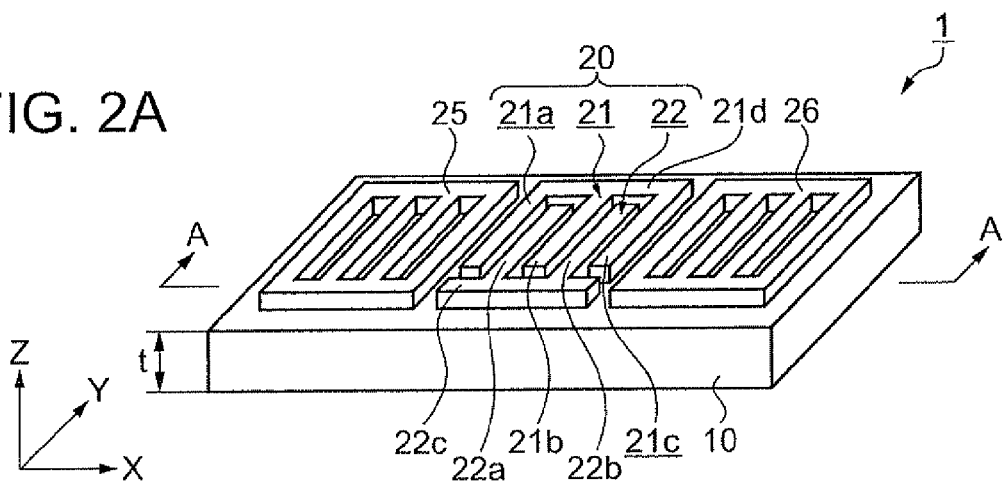
FIGS. 2A and 2B are diagrams showing a Lamb-wave resonator according to the first embodiment.
Figure 2B:
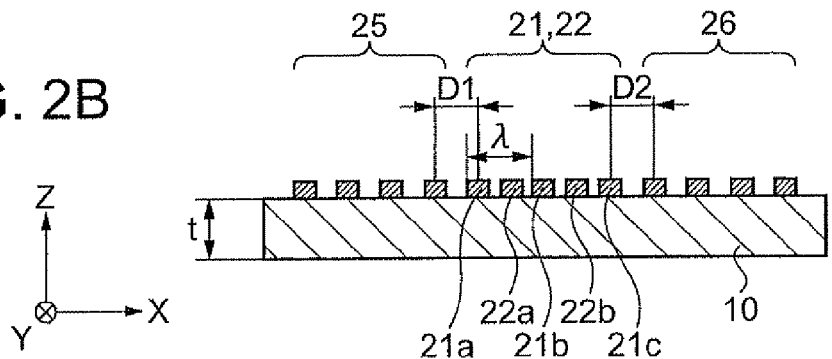

FIGS. 2A and 2B show the Lamb-wave resonator according to the first embodiment. FIG. 2A is a perspective view schematically showing a configuration thereof, while FIG. 2B is a cross-sectional view taken along the line A-A in FIG. 2A. The quartz substrate 10 according to the first embodiment is a rotated Y cut quartz substrate having a cutout direction in which the Z axis in a thickness direction is rotated up to Z' by the angle θ. In the figure, the quartz substrate 10 is cut out so that a longitudinal direction is the X axis, the width direction is Y, and the thickness direction is Z' (refer to FIG. 1).

In FIGS. 2A and 2B, a Lamb-wave resonator 1 includes the quartz substrate 10, an interdigital transducer (IDT) electrode 20 in a comb-tooth shape formed in an X-axis direction of one of main surfaces of the substrate 10, a pair of reflectors 25 and 26 formed on both sides of the IDT electrode 20 in the propagation direction of the Lamb wave. Therefore, the propagation direction of the Lamb wave is the X-axis direction.

Further, when a thickness of the quartz substrate 10 is t, and a wavelength of the Lamb wave to be propagated is λ, a standardized substrate thickness $t/\lambda$ is set to be in a range expressed by $0 < t/\lambda \leq 3$.

The IDT electrode 20 includes aluminum electrodes composed of an input IDT electrode 21 and a ground (GND) IDT electrode 22. The input IDT electrode 21 includes electrode finger elements 21a, 21b, and 21c formed in a same length and arranged parallel to each other. One ends of the electrode finger elements 21a, 21b, and 21c are coupled by a bus bar electrode 21d, The GND IDT electrode 22 includes electrode finger elements 22a and 22b formed in a same length and arranged parallel to each other. One ends of the electrode finger elements 22a and 22b are coupled by a bus bar electrode 22c.

The electrode finger elements of the input IDT electrode 21 and the GND IDT electrode 22 are interdigitated to each other. Ends of the electrode finger elements 21a, 21b, and 21c are disposed so as to have a space from the bus bar electrode 22c. Further, ends of the electrode finger elements 22a and 22b are arranged so as to have a space from the bus bar electrode 21d. A width in which the electrode finger elements are crossed when the electrode finger elements 21a, 21b, and 21c of the input IDT electrode 21 and the electrode finger elements 22a and 22b of the GND IDT electrode 22 are interdigitated to each other is represented as a cross width.

In FIGS. 2A and 2B, the number of the electrode finger elements of the IDT electrode 20 and the reflectors 25 and 26 are simplified. Therefore, in practice, several tens to several hundreds of the electrode finger elements will be respectively formed.

The quartz substrate 10 is a thin substrate having surfaces in the directions of the X axis called the electrical axis, the Y axis called the mechanical axis, and the Z axis called the optical axis. However, the quartz substrate 10 according to the first embodiment is the rotated Y cut quartz substrate having the cutout direction in which the Z axis in the thickness direction is rotated up to Z' by the angle θ. In the figure, the axis directions of the quartz substrate 10 are indicated. Therefore, the thickness direction is represented as Z, and the propagation direction of the Lamb wave is represented as X, while a direction perpendicular to the propagation direction of the Lamb wave is represented as Y. Further, the X direction may be represented as a lengthwise direction, and the Y direction may be represented as a widthwise direction.

In the first embodiment, when a pitch of the electrode finger elements 21a, 21b, and 21c, and a pitch of the electrode finger elements 22a and 22b are represented as λ (a wavelength of the Lamb wave), a width of each of the electrode finger elements and a distance between the electrode finger elements are represented as (¼)λ.

In the Lamb-wave resonator 1, the quartz substrate 10 is excited by a driving signal inputted to the input IDT electrode 21 at a predetermined frequency. An acoustic wave excited as above propagates towards the X direction of the quartz substrate 10 while being reflected at top and bottom surfaces of the quartz substrate 10. The acoustic wave propagating as above is called as a Lamb wave. A configuration of the IDT electrode 20 is similar to that of a surface acoustic wave (SAW) resonator. However, since a type of waves to be used is different, its characteristic is different, and thus design conditions are naturally different from those of the SAW resonator. Further, the Lamb wave propagating from the IDT electrode 20 is reflected by the reflectors 25 and 26.

Accordingly, a distance D1 from a center of the electrode finger element 21a in the propagation direction of the Lamb wave to a center of a closest one of electrode finger elements of the reflector 25 to the electrode finger element 21a in the propagation direction of the Lamb wave, and a distance D2 similarly from a center of the electrode finger element 21c in the propagation direction of the Lamb wave to a center of a closest one of electrode finger elements of the reflector 26 in the propagation direction of the Lamb wave are set to be (½)nλ (n is an integer number). Further, a reflection wave is set so that the driving signal coincides with a phase at a predetermined frequency.

However, a distance from the electrode finger element 21a to the reflector 25, and a distance from the electrode finger element 21c to the reflector 26 may be other than (½)λ.

Subsequently, a relation between the standardized substrate thickness $t/\lambda$ and a phase velocity will be explained with reference to drawings.

Figure 3:
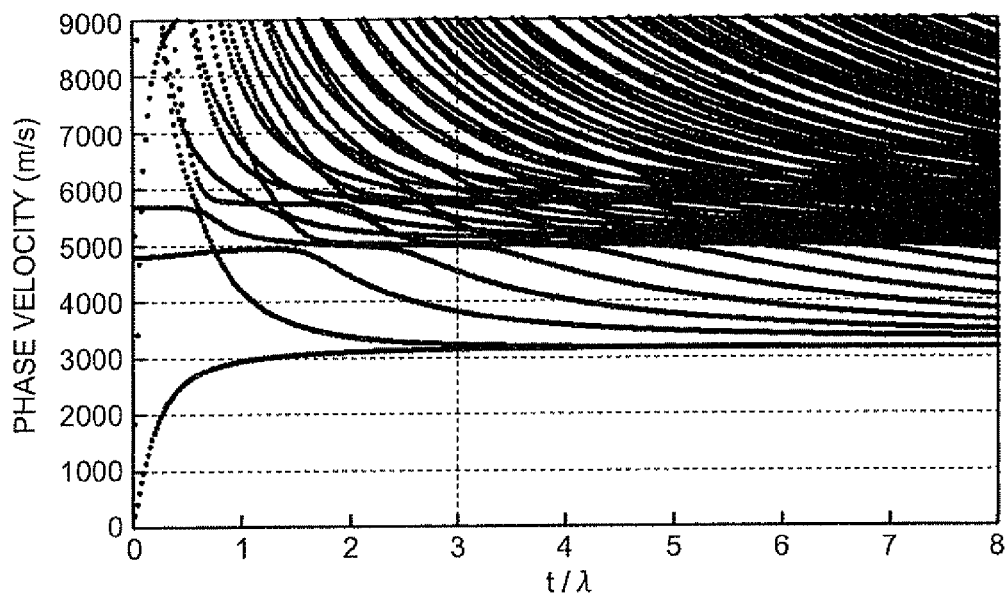
FIG. 3 is a graph showing a relation between a standardized substrate thickness t/λ and a phase velocity.

FIG. 3 is a graph showing a relation between the standardized substrate thickness $t/\lambda$ and the phase velocity. The horizontal axis indicates the standardized substrate thickness $t/\lambda$, while the vertical axis indicates the phase velocity (m/s). Here, a Lamb-wave resonator employing the quarts substrate 10 is exemplified as a piezoelectric substrate. FIG. 3 shows that the Lamb-wave resonator 1 has a plurality of modes. As the standardized substrate thickness $t/\lambda$ increases, the phase velocities in respective modes aggregate in a range from 300 (m/s) to 6000 (m/s), particularly, densely aggregate in a range from 5000 (m/s) to 6000 (m/s).

A case where the modes densely aggregate as above easily cause mode coupling. Therefore, it is considered that a desired mode is not obtained and the phase velocity easily varies. Here, if the standardized substrate thickness is set to be $t/\lambda \leq 3$, the range easily causing mode coupling can be avoided.

Further, FIG. 3 shows that the smaller the standardized substrate thickness $t/\lambda$ is, the more the phase velocity tends to improve. When the standardized substrate thickness $t/\lambda$ is $t/\lambda \leq 3$, the number of modes having a phase velocity of 6000 (m/s) or more are found. The phase velocity is represented by a product of a frequency and a wavelength. Therefore, this indicates that the Lamb-wave resonator is applicable for being used at a high frequency.

Next, the configuration of the IDT electrode 20 will be described.

Figure 4:
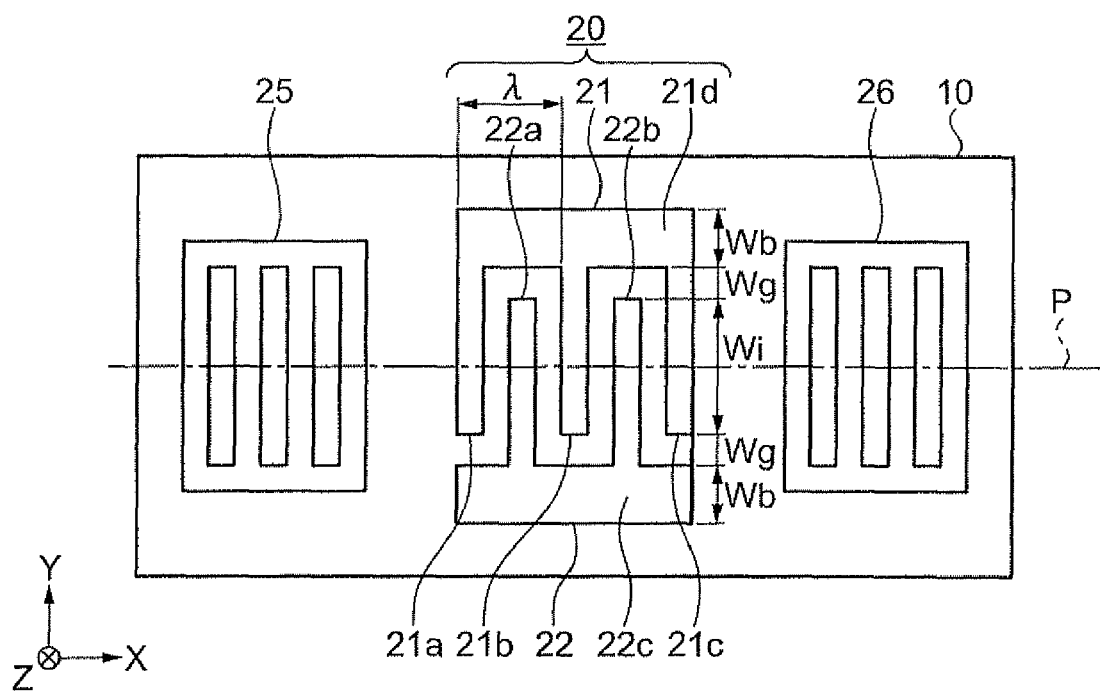
FIG. 4 is an overhead plan view of the Lamb-wave resonator shown in FIG. 2A.
Figure 5:
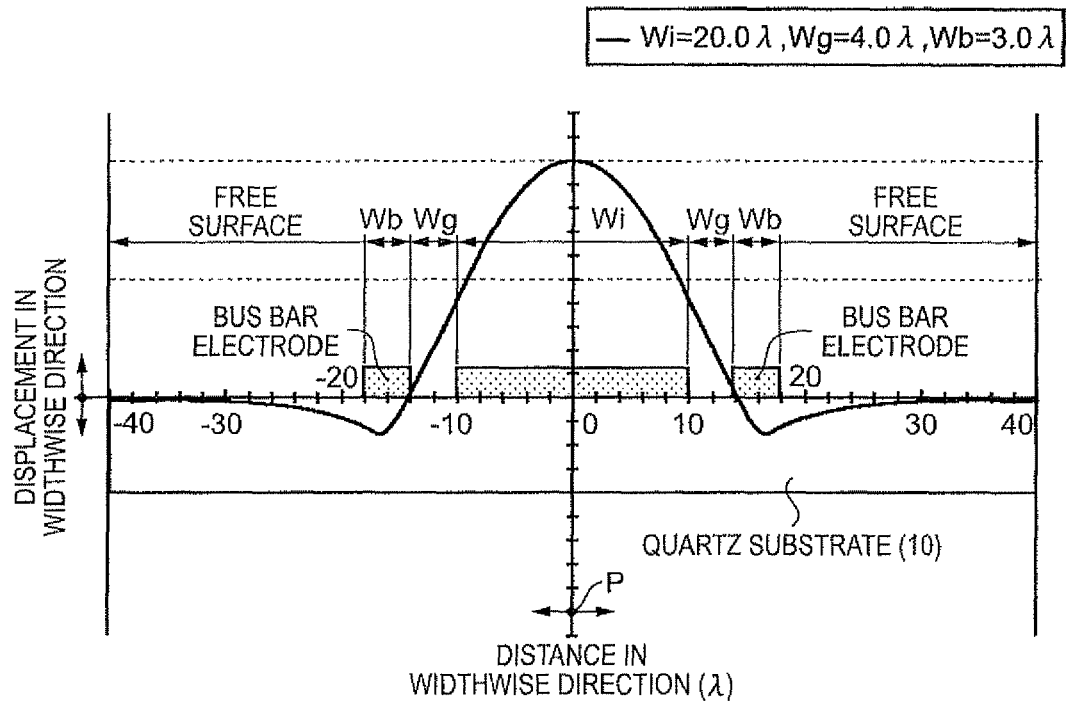
FIG. 5 is a graph showing a calculation result according to Example 1.

FIG. 4 is an overhead plan view of the Lamb-wave resonator shown in FIG. 2A. In an optimum electrode design parameter proposed by the embodiment, a width of the bus bar electrodes 21d and 22c is represented as Wb, a distance from the electrode finger elements 21a, 21b, and 21c to the bus bar electrode 22c, and a distance from the electrode finger elements 22a and 22b to the bus bar electrode 21d are represented as Wg, a cross width in which the electrode finger elements when the electrode finger elements 21a, 21b, and 21c, and the electrode finger elements 22a and 22b are interdigitated to each other is represented as Wi. A center position of the quartz substrate 10 in the Y direction (widthwise direction) is represented as a center line P. The IDT electrode 20 and the reflectors 25 and 26 are formed on the center line P.

Next, specific working examples according to the first embodiment will be described.

First, a differential equation controlling a displacement in the (Y) direction of the Lamb wave will be described. The differential equation is a formula obtained by Lagrangian L=T−U (T is kinetic energy, and U is potential energy) that is obtained by integrating vibration energy of the Lamb-wave resonator in length and depth directions, and expressed as follows.

Formula 1

$$a\omega_o^2 \frac{\partial^2 U(Y)}{\partial Y^2} + (\omega^2 - \omega_o^2)U(Y) = 0 \qquad (1)$$

Here, U (Y) indicates a displacement in the width direction, Y indicates a y coordinate (y/λ) standardized by the wavelength λ of the Lamb wave, a constant number "a" indicates a shear effect coefficient in the widthwise direction, ω indicates an angular frequency, $\omega_o$ indicates an angular frequency of the Lamb-wave resonator having electrode finger elements whose cross width is infinite. The constant number "a" is obtained from an analysis result, or a measurement result. In the embodiment, the constant number "a" is 0.021. Based on the differential equation, the displacement in the widthwise direction of the Lamb-wave resonator is calculated.

Subsequently, calculation results of the specific working examples will be described with reference to FIGS. 5 through 71.

Example 1

FIG. 5 shows a calculation result according to Example 1. In a graph of FIG. 5, the horizontal axis indicates a distance from the center line P in the widthwise direction (Y direction), and the vertical axis indicates a displacement in the widthwise direction (Y direction) when the parameters of the IDT electrode are Wi=20λ, Wg=4.0λ, and Wb=3.0λ. Each of the parameters is standardized by the wavelength λ. As shown in FIG. 5, the displacement is the largest at a center (center line P) of the IDT electrode 20. The displacement drastically converges as being away from the center. Further, the displacement converges on free surfaces (only a region of the quartz substrate without electrodes) from outer edges of the bus bar electrodes to outer edges of the quartz substrate. This shows a state in which a vibration leakage hardly occurs at outer sides from the bus bar electrodes, that is, a state in which energy is trapped.

As described above, suppressing a vibration leakage in a widthwise direction can dramatically reduce amplitude of a reflection wave occurring at an outer edge of a piezoelectric substrate in the widthwise direction. Therefore, a spurious caused by reflection waves from the outer edge of the piezoelectric substrate in the widthwise direction can be reduced.

The vibration leakage to the free surfaces is suppressed as above, suppressing a decrease of a Q value and an increase of a CI value. The Q value and the CI value are major factors for evaluating resonance characteristics of a resonator. Therefore, with a high Q value, resonance of the Lamb-wave resonator can be stably maintained, while with a low CT value, power consumption reduction can be realized.

Example 2

Figure 6:
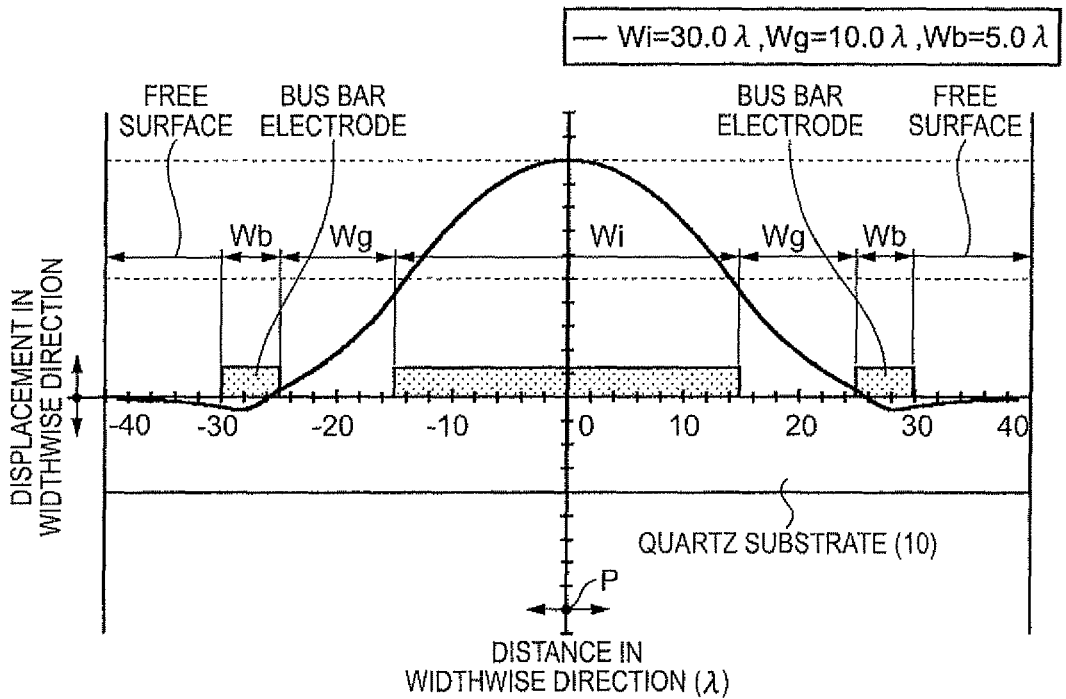
FIG. 6 is a graph showing a calculation result according to Example 2.

FIG. 6 shows a calculation result according to Example 2 and indicates a displacement in the widthwise direction when the parameters of the IDT electrode are Wi=30λ, Wg=10.0λ, and Wb=5.0λ. As shown in FIG. 6, the displacement on the free surfaces in the widthwise direction converges at the outer edges of the quartz substrate in the Y direction.

Example 3

Figure 7:
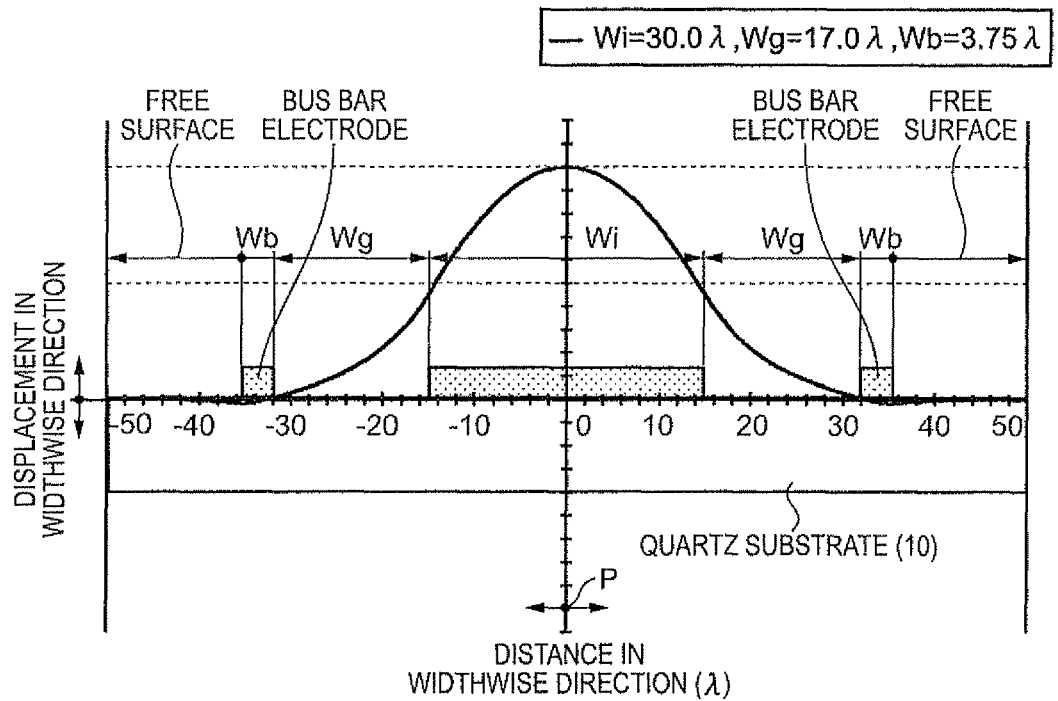
FIG. 7 is a graph showing a calculation result according to Example 3.

FIG. 7 shows a calculation result according to Example 3 and indicates a displacement in the widthwise direction when the parameters of the IDT electrode are Wi=30λ, Wg=17.0λ, and Wb=3.75λ.

Example 4

Figure 8:
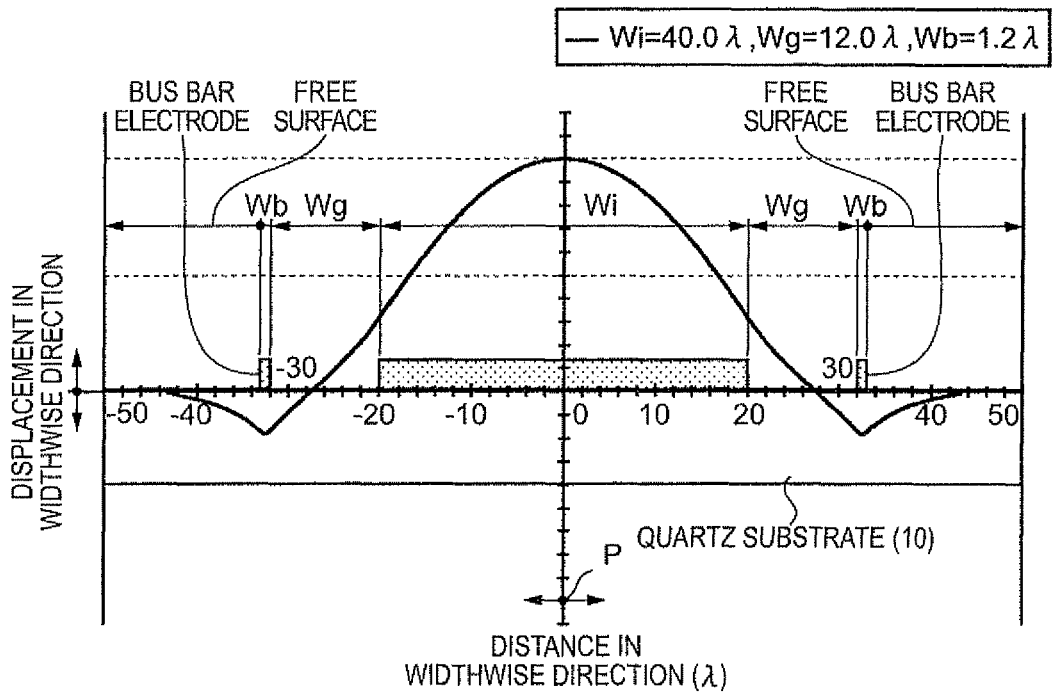
FIG. 8 is a graph showing a calculation result according to Example 4.

FIG. 8 shows a calculation result according to Example 4 and indicates a displacement in the widthwise direction when the parameters of the IDT electrode are Wi=40λ, Wg=12.0λ, and Wb=1.2λ.

Example 5

Figure 9:
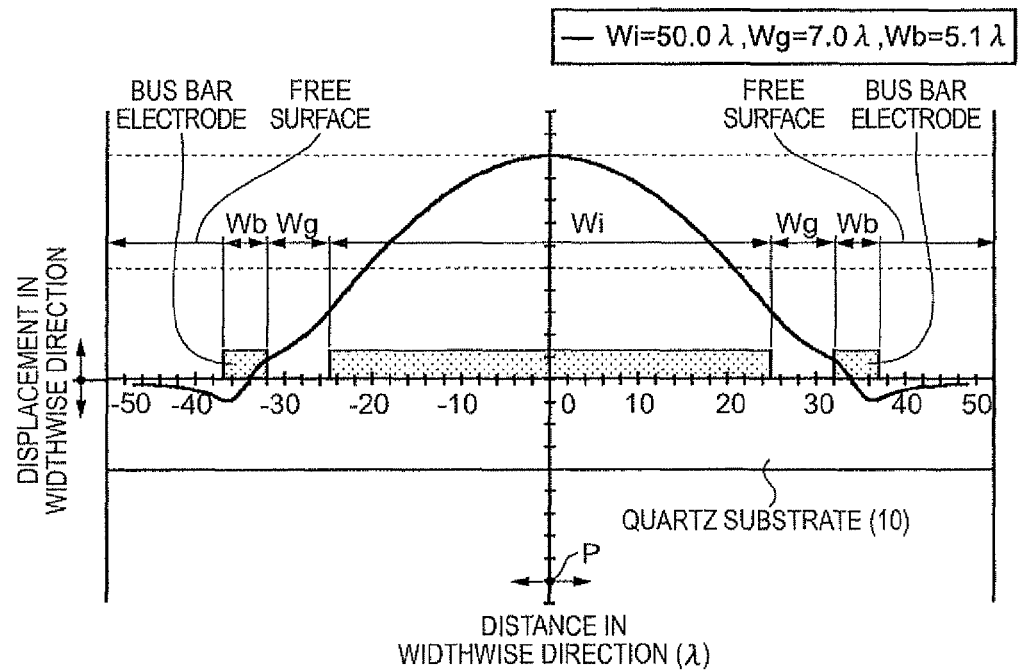
FIG. 9 is a graph showing a calculation result according to Example 5.

FIG. 9 shows a calculation result according to Example 5 and indicates a displacement in the widthwise direction when the parameters of the IDT electrode are Wi=50λ, Wg=7.0λ, and Wb=5.1λ.

Example 6

Figure 10:
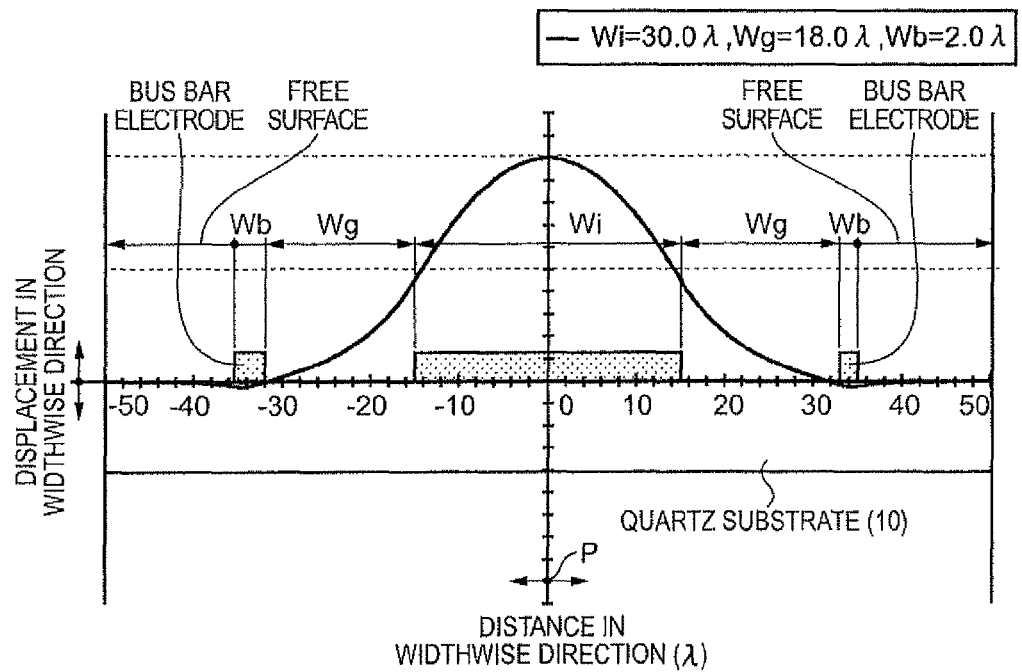
FIG. 10 is a graph showing a calculation result according to Example 6.

FIG. 10 shows a calculation result according to Example 6 and indicates a displacement in the widthwise direction when the parameters of the IDT electrode are Wi=30λ, Wg=18.0λ, and Wb=2.0λ.

Example 7

Figure 11:
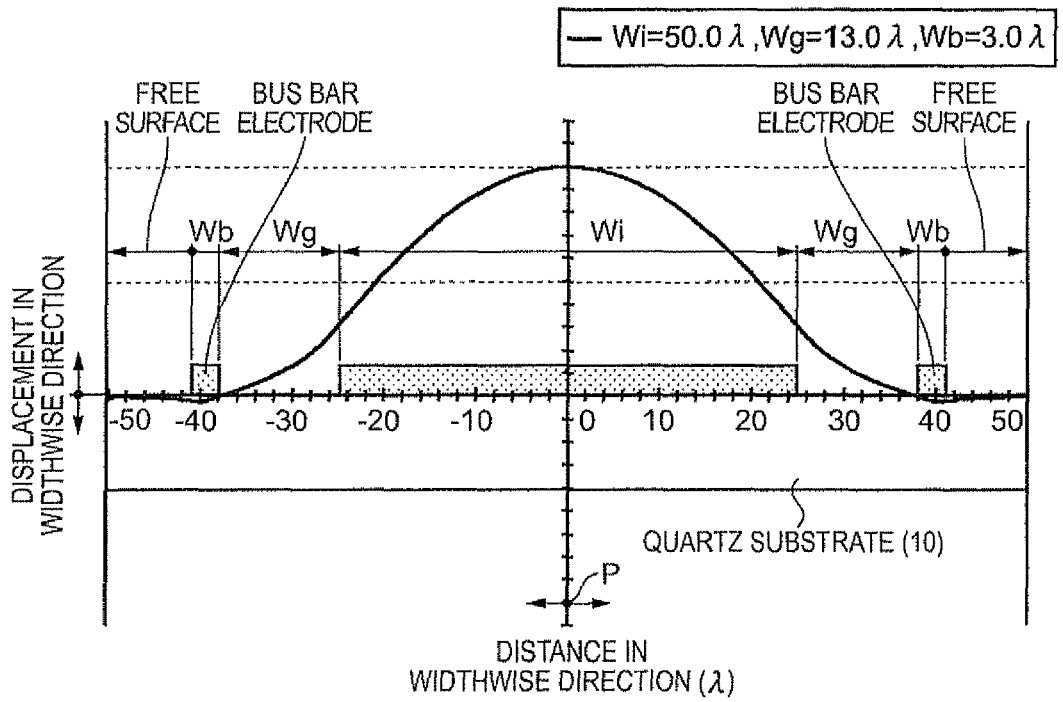
FIG. 11 is a graph showing a calculation result according to Example 7.

FIG. 11 shows a calculation result according to Example 7 and indicates a displacement in the widthwise direction when the parameters of the IDT electrode are Wi=50λ, Wg=13.0λ, and Wb=3.0λ.

Example 8

Figure 12:
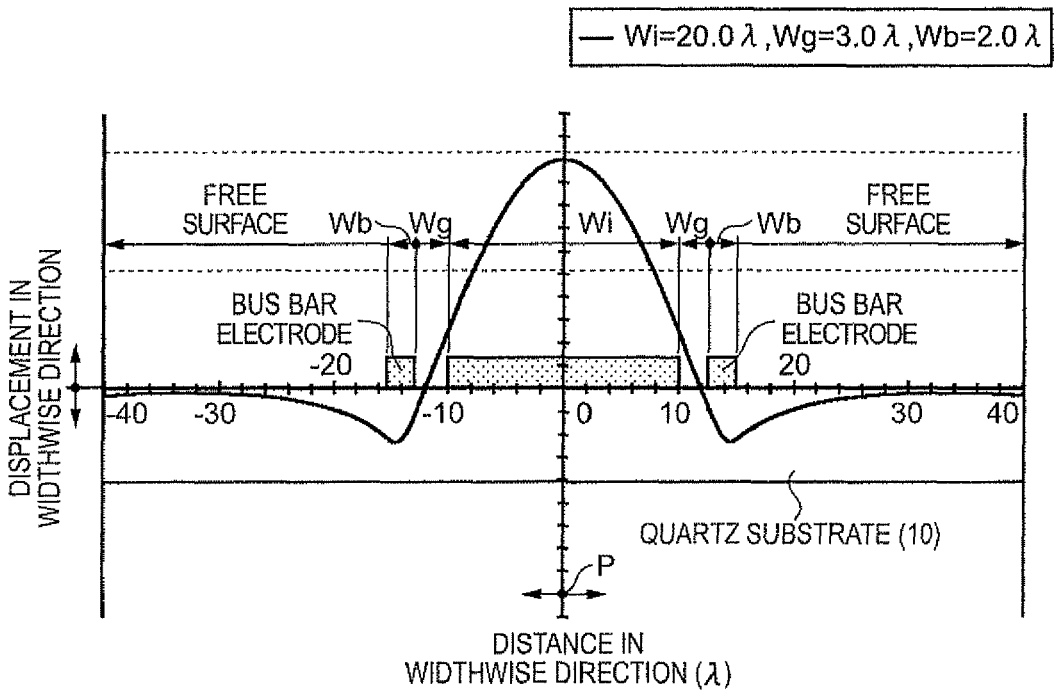
FIG. 12 is a graph showing a calculation result according to Example 8.

FIG. 12 shows a calculation result according to Example 8 and indicates a displacement in the widthwise direction when the parameters of the IDT electrode are Wi=20λ, Wg=3.0λ, and Wb=2.0λ.

Each of the displacements in the widthwise direction shown in Examples 1 to 8 above tends to converge on the free surfaces although size of difference in the vicinity of the bus bar electrodes varies. This indicates a state in which the vibration leakage hardly occurs at the outer sides from the bus bar electrodes, that is, a state in which energy is trapped.

Example 9

Next, a displacement in the widthwise direction in a case of a resonance state designed by out of a range of the optimum electrode design will be described.

Figure 13:
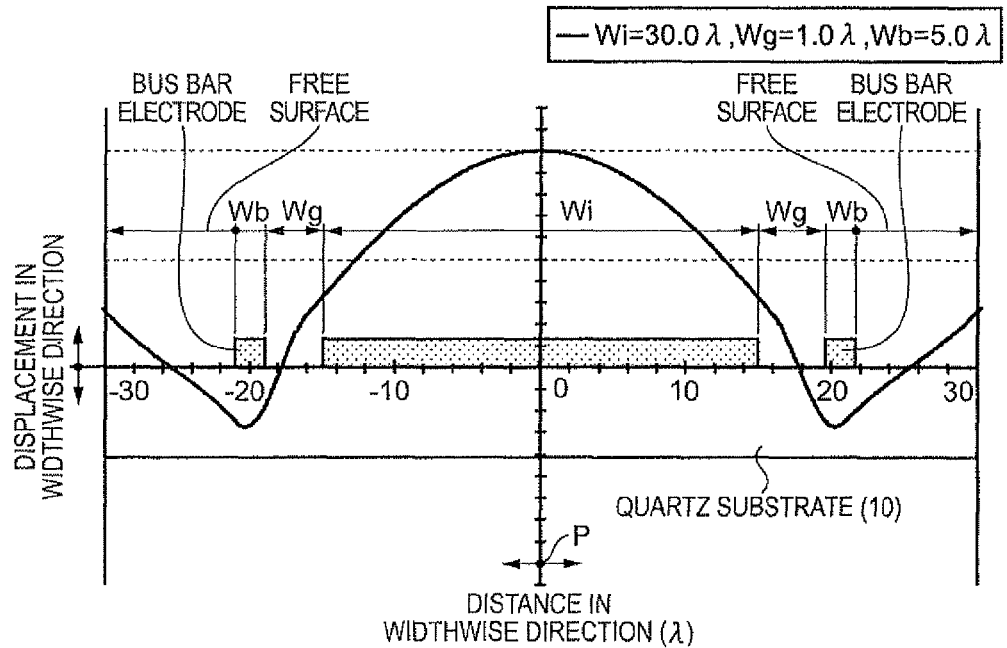
FIG. 13 is a graph showing a calculation result according to Example 9.

FIG. 13 shows a calculation result according to Example 9 and indicates a displacement in the widthwise direction when the parameters of the IDT electrode are Wi=30λ, Wg=1.0λ, and Wb=5.0λ. Also in Example 9, the displacement is the largest at the center of the IDT electrode. However, clear difference from Example 1 (refer to FIG. 5) is that the displacement on the free surfaces does not converge, but the displacement at the outer edges of the quartz substrate in the widthwise direction is large. That is, this indicates that energy is not trapped because the vibration leakage occurs.

Further, if the vibration leakage from the outer edge of the bus bar electrodes 21*d* and 22*c* toward the laterally outer edge of the quartz substrate 10 occurs, a spurious is caused by a reflection wave from the outer edge of the quartz substrate 10.

Example 10

Figure 14:
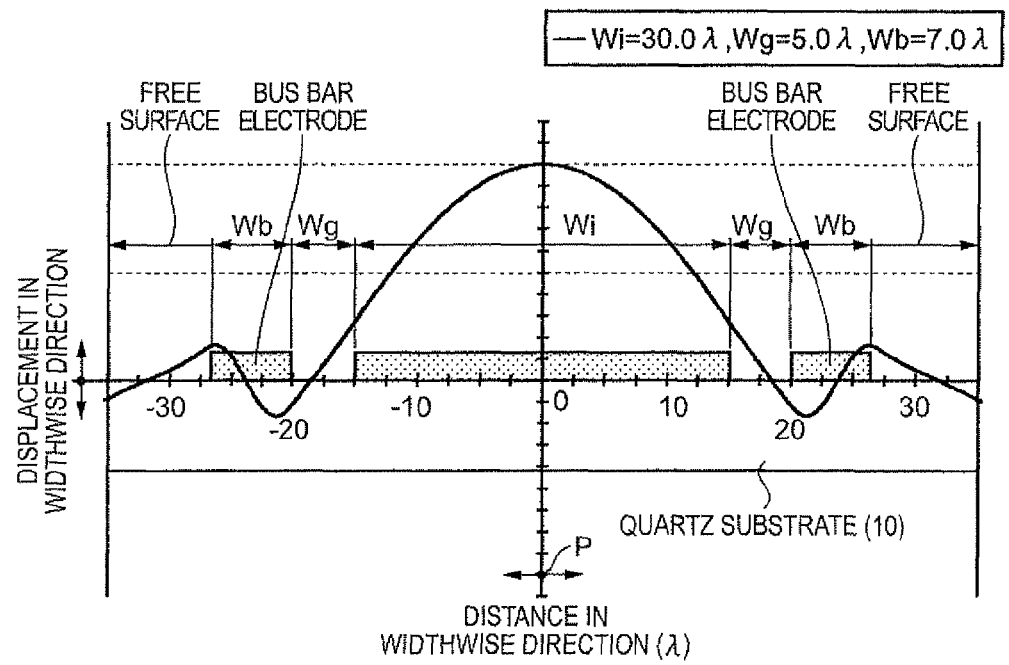
FIG. 14 is a graph showing a calculation result according to Example 10.

FIG. 14 shows a calculation result according to Example 10 and indicates a displacement in the widthwise direction when the parameters of the IDT electrode are Wi=30λ, Wg=5.0λ, and Wb=7.0λ.

Example 11

Figure 15:
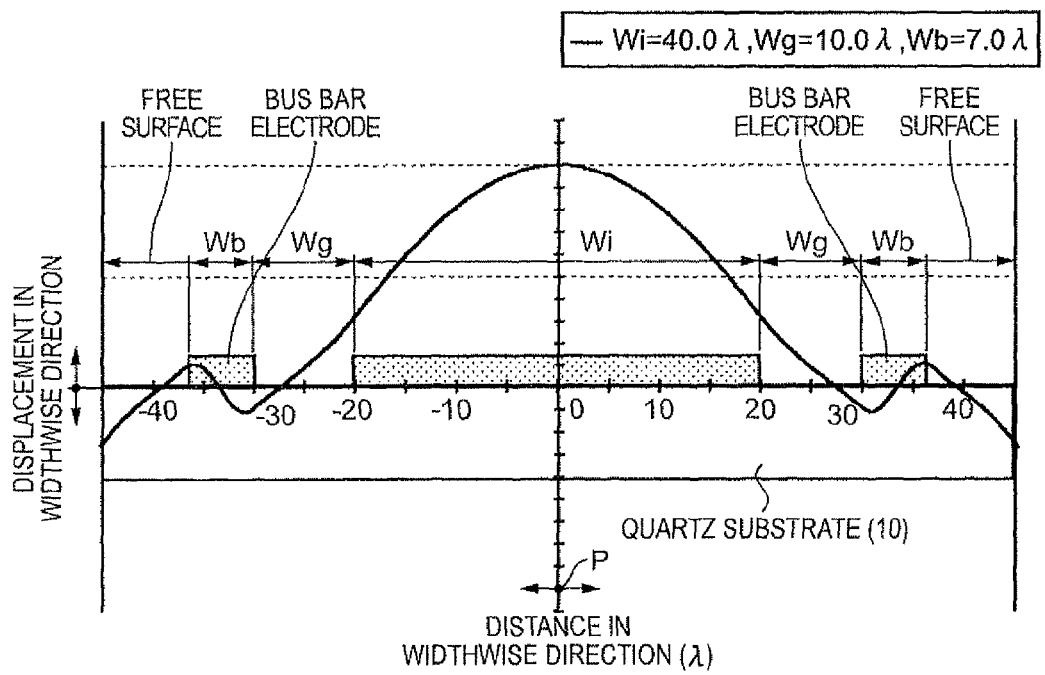
FIG. 15 is a graph showing a calculation result according to Example 11.

FIG. 15 shows a calculation result according to Example 11 and indicates a displacement in the widthwise direction when the parameters of the IDT electrode are Wi=40λ, Wg=10.0λ, and Wb=7.0λ.

Example 12

Figure 16:
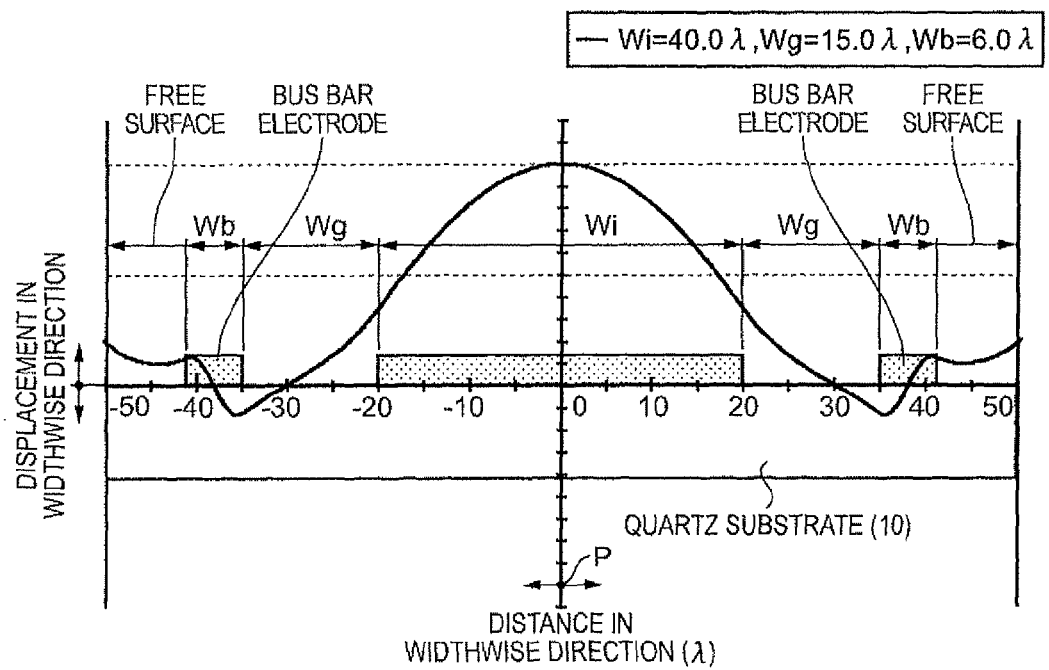
FIG. 16 is a graph showing a calculation result according to Example 12.

FIG. 16 shows a calculation result according to Example 12 and indicates a displacement in the widthwise direction when the parameters of the IDT electrode are Wi=40λ, Wg=15.0λ, and Wb=6.0λ.

Example 13

Figure 17:
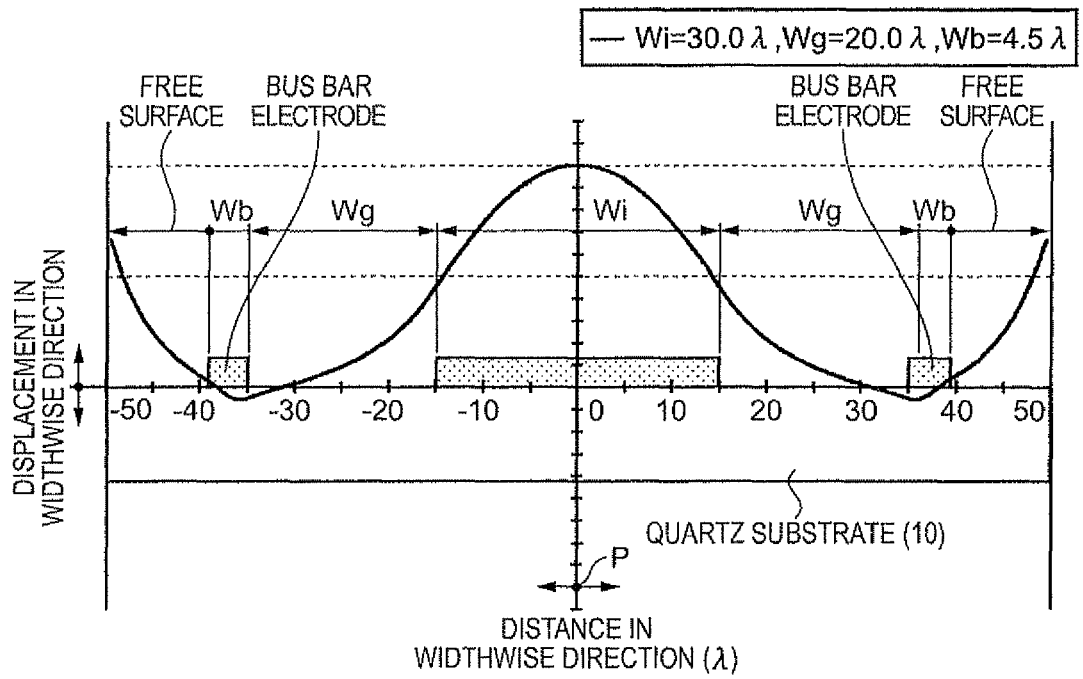
FIG. 17 is a graph showing a calculation result according to Example 13.

FIG. 17 shows a calculation result according to Example 13 and indicates a displacement in the widthwise direction when the parameters of the IDT electrode are Wi=30λ, Wg=20.0λ, and Wb=4.5λ.

Example 14

Figure 18:
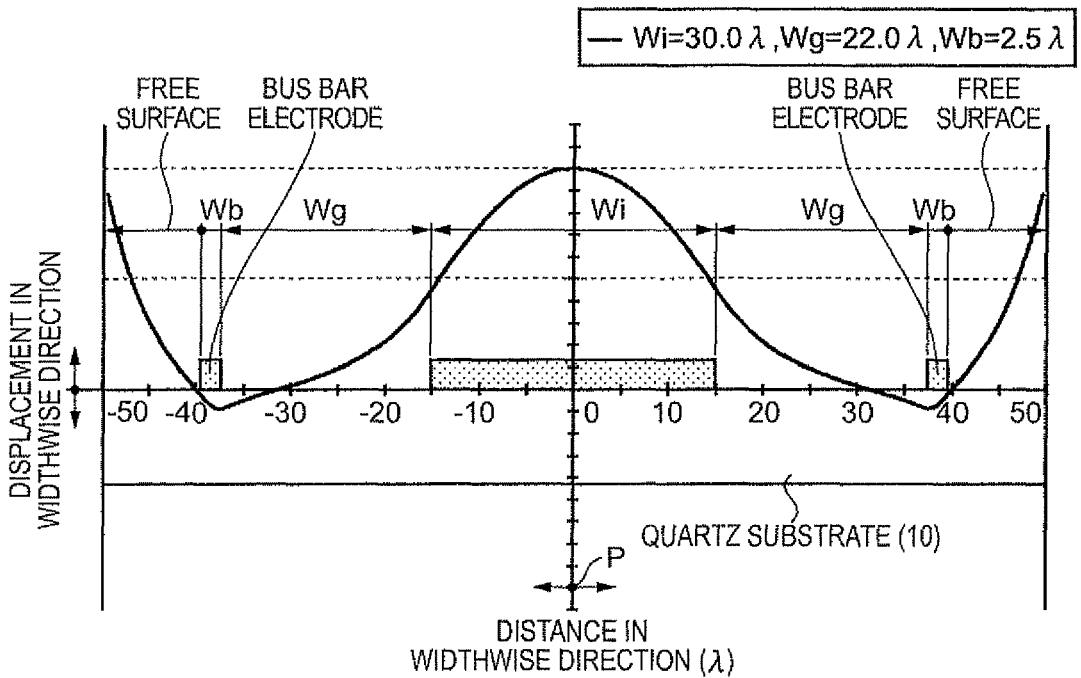
FIG. 18 is a graph showing a calculation result according to Example 14.

FIG. 18 shows a calculation result according to Example 14 and indicates a displacement in the widthwise direction when the parameters of the IDT electrode are Wi=30λ, Wg=22.0λ, and Wb=2.5λ.

Example 15

Figure 19:
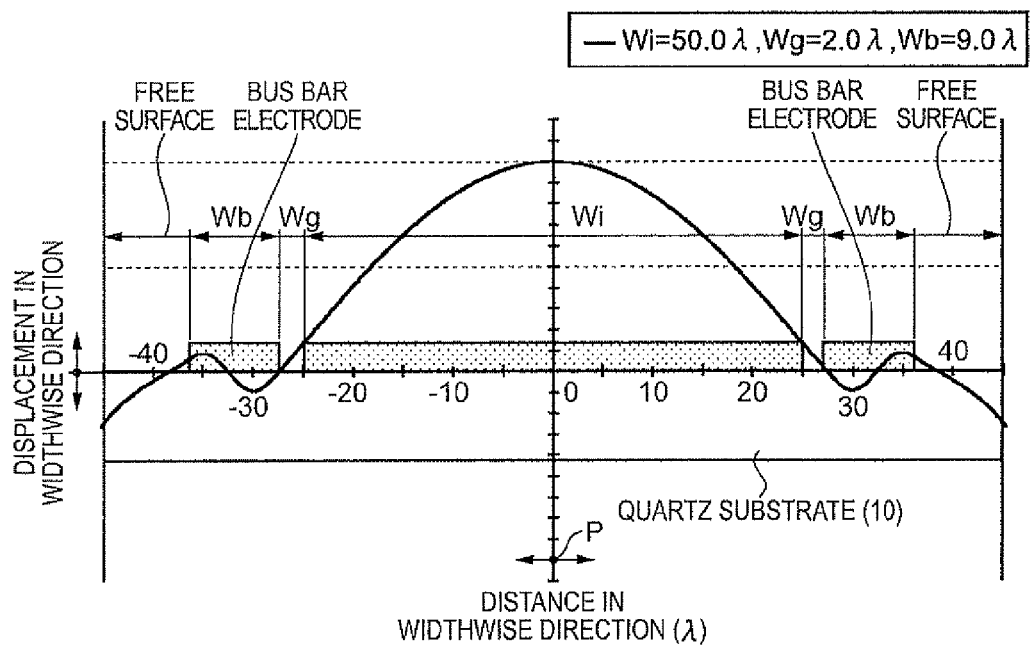
FIG. 19 is a graph showing a calculation result according to Example 15.

FIG. 19 shows a calculation result according to Example 15 and indicates a displacement in the widthwise direction when the parameters of the IDT electrode are Wi=50λ, Wg=2.0λ, and Wb=9.0λ.

Example 16

Figure 20:
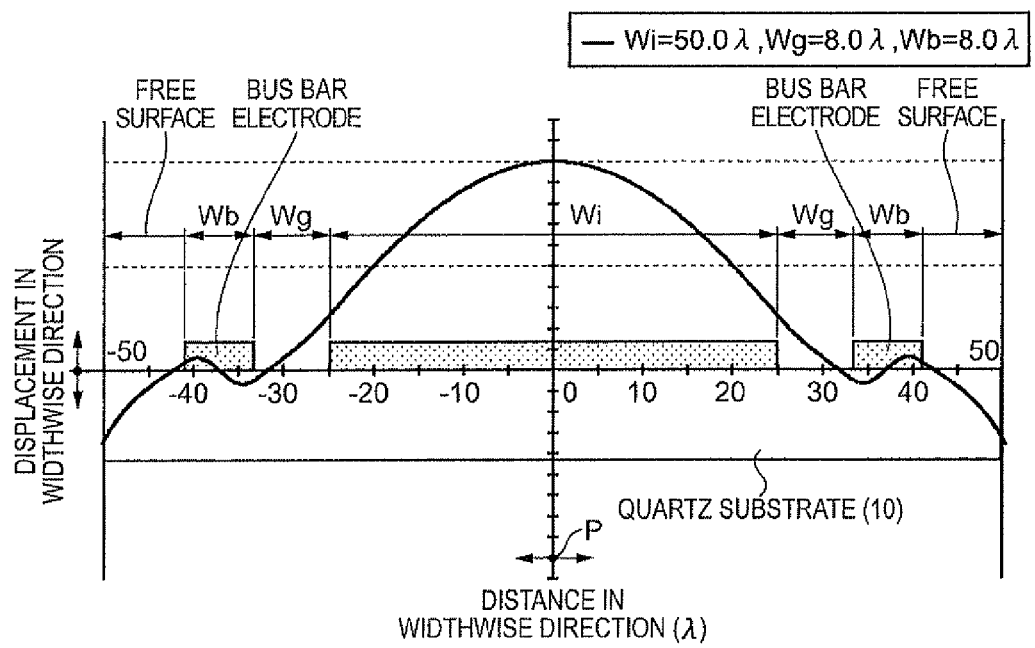
FIG. 20 is a graph showing a calculation result according to Example 16.

FIG. 20 shows a calculation result according to Example 16 and indicates a displacement in the widthwise direction when the parameters of the IDT electrode are Wi=50λ, Wg=8.0λ, and Wb=8.0λ.

Example 17

Figure 21:
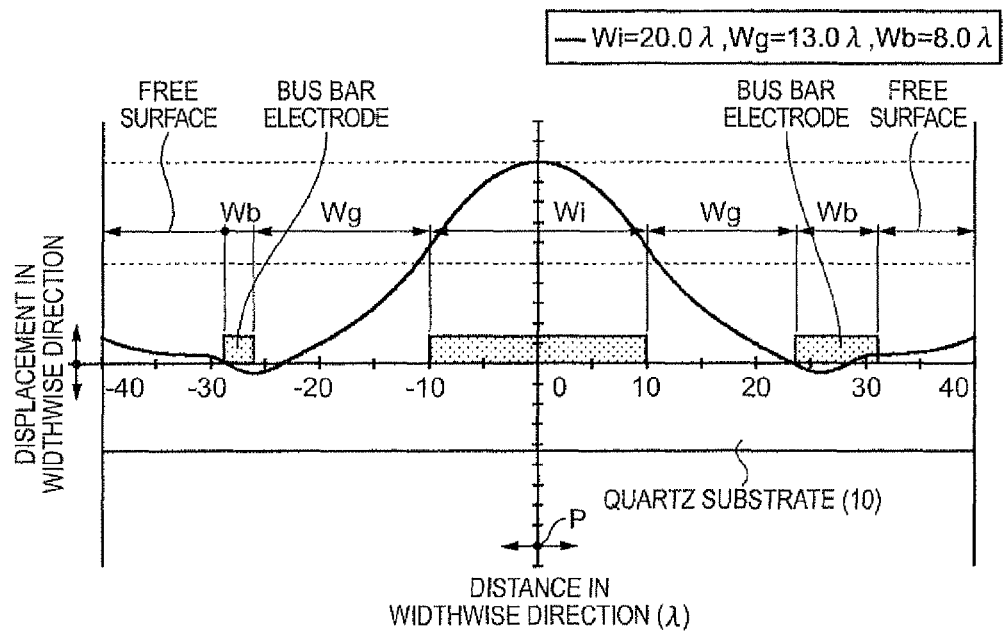
FIG. 21 is a graph showing a calculation result according to Example 17.

FIG. 21 shows a calculation result according to Example 17 and indicates a displacement in the widthwise direction when the parameters of the IDT electrode are Wi=20λ, Wg=13.0λ, and Wb=8.0λ.

Example 18

Figure 22:
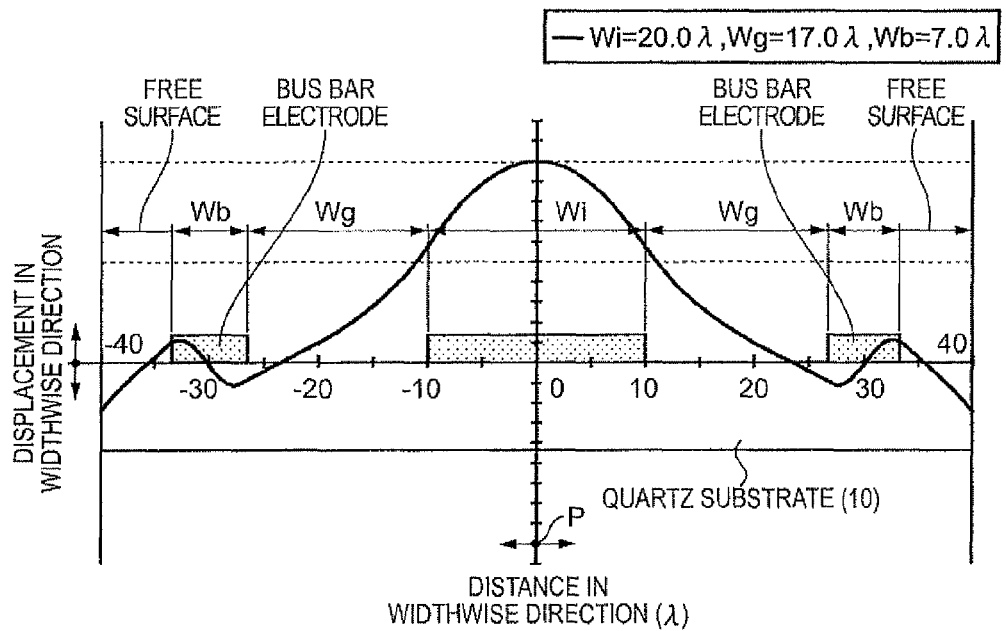
FIG. 22 is a graph showing a calculation result according to Example 18.

FIG. 22 shows a calculation result according to Example 18 and indicates a displacement in the widthwise direction when the parameters of the IDT electrode are Wi=20λ, Wg=17.0λ, and Wb=7.0λ.

Example 19

Figure 23:
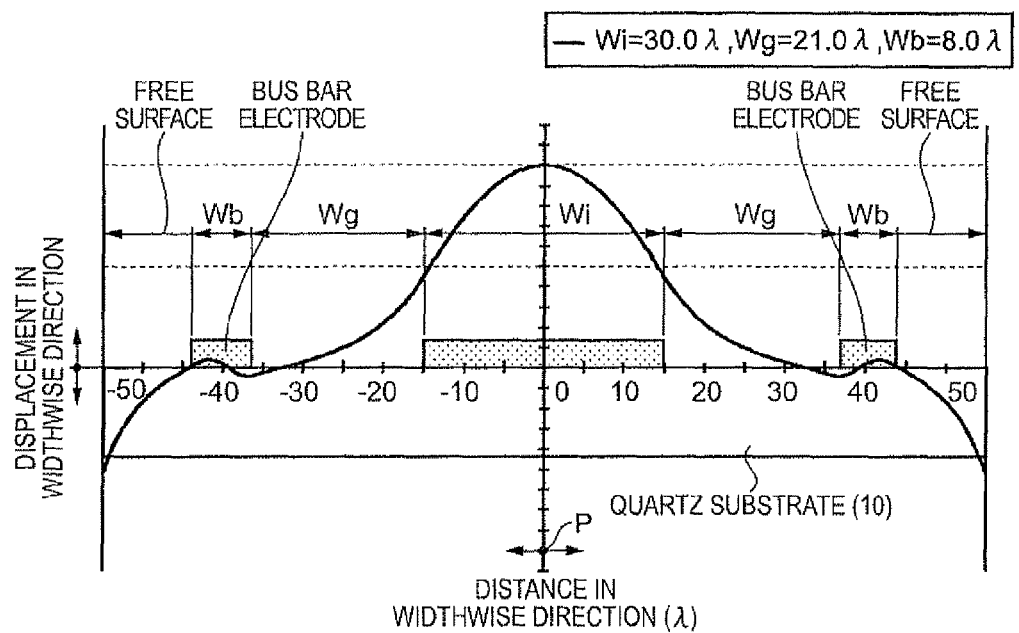
FIG. 23 is a graph showing a calculation result according to Example 19.

FIG. 23 shows a calculation result according to Example 19 and indicates a displacement in the widthwise direction when the parameters of the IDT electrode are Wi=30λ, Wg=21.0λ, and Wb=8.0λ.

Example 20

Figure 24:
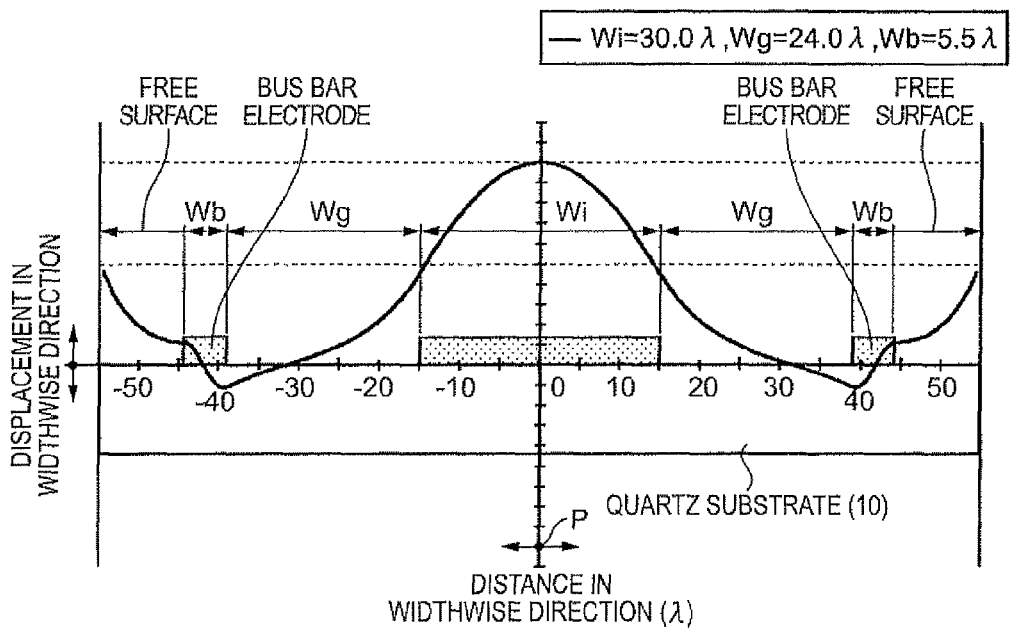
FIG. 24 is a graph showing a calculation result according to Example 20.

FIG. 24 shows a calculation result according to Example 20 and indicates a displacement in the widthwise direction when the parameters of the IDT electrode are Wi=30λ, Wg=24.0λ, and Wb=5.5λ.

Each of the displacements in the widthwise direction shown in Examples 9 to 20 above does not converge on the free surfaces although variation in size of displacement amounts and difference in displacement directions are found in the vicinity of the bus bar electrodes. This shows a state in which a vibration leakage occurs at the outer sides from the bus bar electrodes, that is, a state in which energy is not trapped.

Further, other working examples will be described.

Example 21

Figure 25:
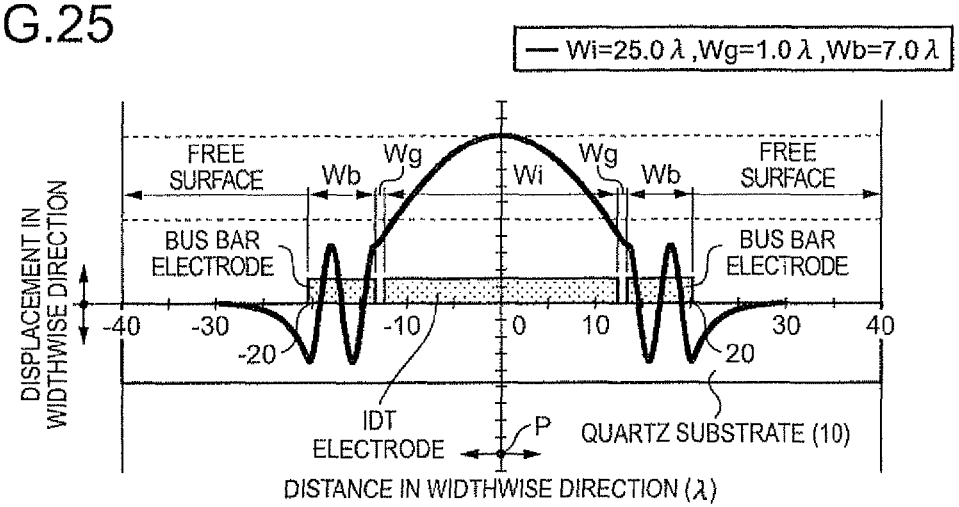
FIG. 25 is a graph showing a calculation result according to Example 21.

FIG. 25 shows a calculation result according to Example 21 and indicates a displacement in the widthwise direction when the parameters of the IDT electrode are Wi=25.0λ, Wg=1.0λ, and Wb=7.0λ. According to Example 21, a vibration leakage occurs in the vicinity of the outer edges of the bus bar electrodes, however, the displacement converges on the free surfaces from the outer edges of the bus bar electrodes to the outer edges of the quartz substrate.

Example 22

Figure 26:
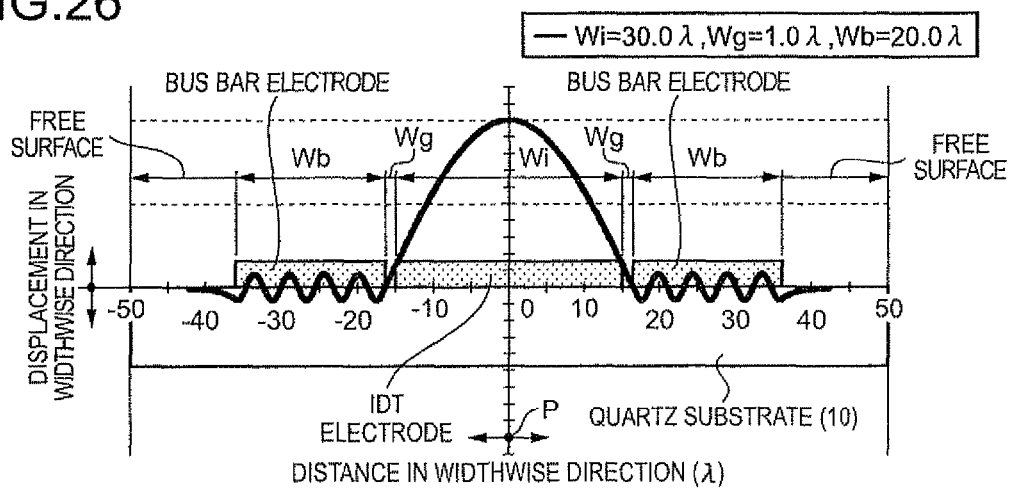
FIG. 26 is a graph showing a calculation result according to Example 22.

FIG. 26 shows a calculation result according to Example 22 and indicates a displacement in the widthwise direction when the parameters of the IDT electrode are Wi=30.0λ, Wg=1.0λ, and Wb=20.0λ. According to Example 22, a vibration leakage occurs in an area of the bus bar electrodes. However, the displacement converges on the free surfaces from the outer edges of the bus bar electrodes to the outer edges of the quartz substrate.

Example 23

Figure 27:
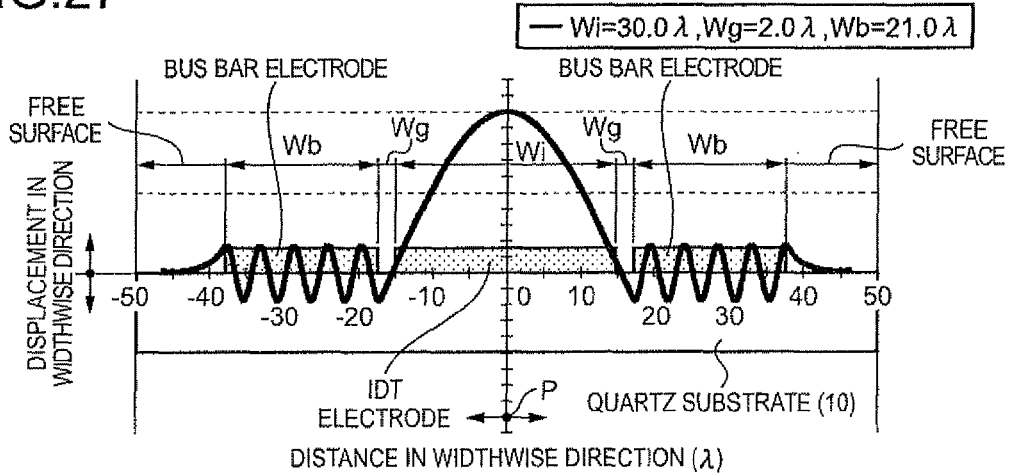
FIG. 27 is a graph showing a calculation result according to Example 23.

FIG. 27 shows a calculation result according to Example 23 and indicates a displacement in the widthwise direction when the parameters of the IDT electrode are Wi=30.0λ, Wg=2.0λ, and Wb=21.0λ. In Example 23, a vibration leakage occurs in the area of the bus bar electrodes. However, the displacement converges on the free surfaces from the outer edges of the bus bar electrodes to the outer edges of the quartz substrate.

Example 24

Figure 28:
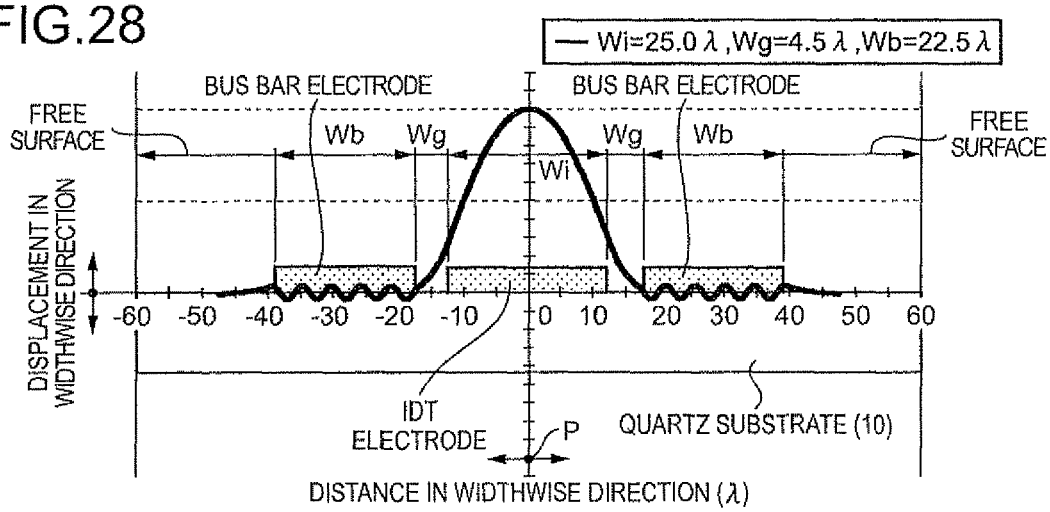
FIG. 28 is a graph showing a calculation result according to Example 24.

FIG. 28 shows a calculation result according to Example 24 and indicates a displacement in the widthwise direction when the parameters of the IDT electrode are Wi=25.0λ, Wg=4.5λ, and Wb=22.5λ.

Example 25

Figure 29:
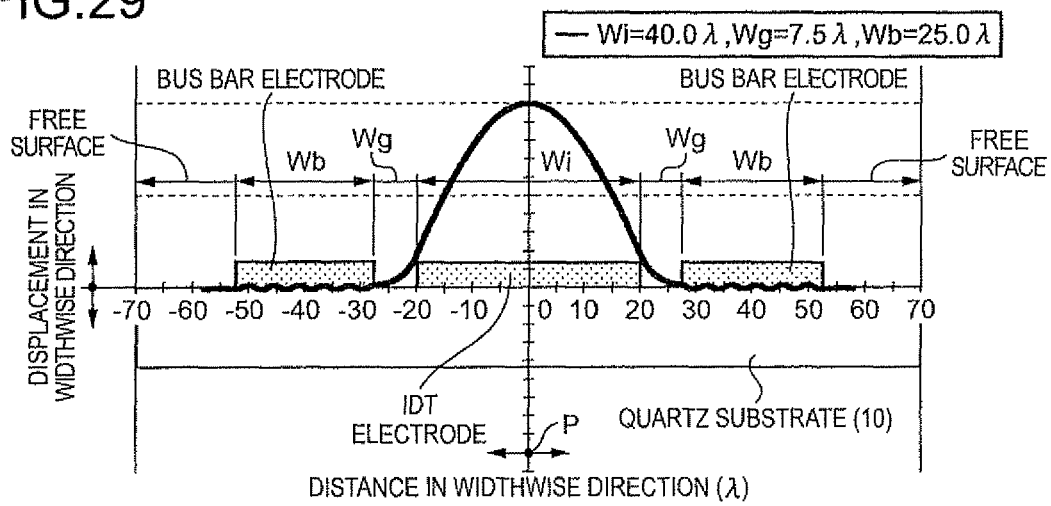
FIG. 29 is a graph showing a calculation result according to Example 25.

FIG. 29 shows a calculation result according to Example 25 and indicates a displacement in the widthwise direction when the parameters of the IDT electrode are Wi=40.0λ, Wg=7.5λ, and Wb=25.0λ.

Example 26

Figure 30:
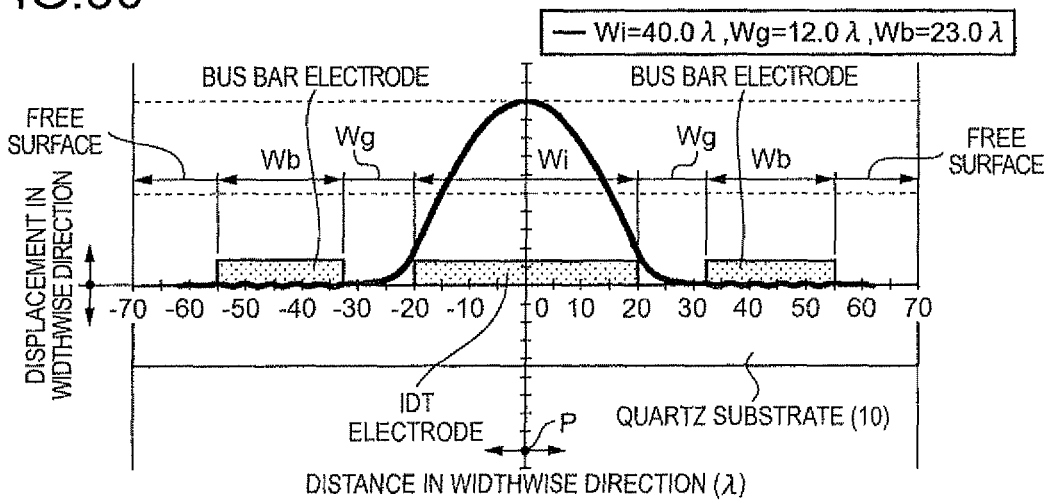
FIG. 30 is a graph showing a calculation result according to Example 26.

FIG. 30 shows a calculation result according to Example 26 and indicates a displacement in the widthwise direction when the parameters of the IDT electrode are Wi=40.0λ, Wg=12.0λ, and Wb=23.0λ.

Example 27

Figure 31:
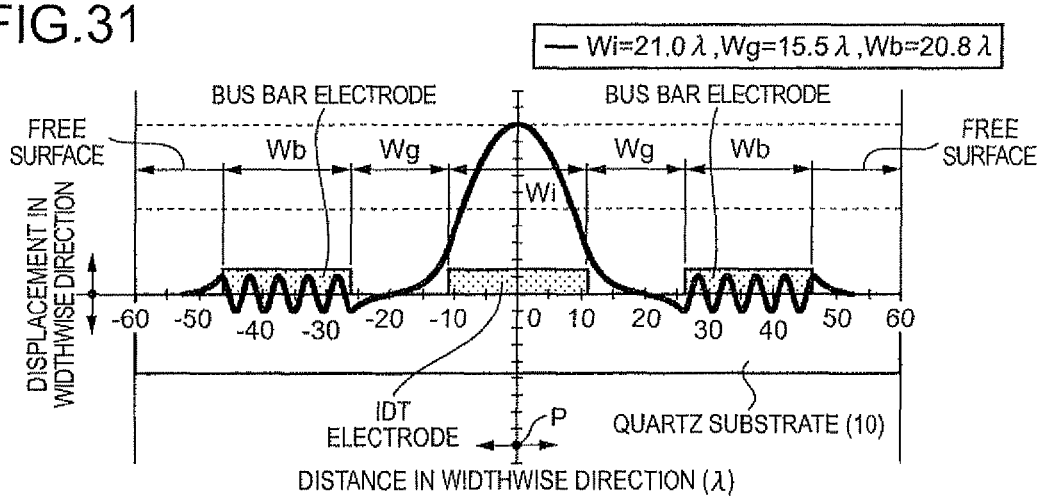
FIG. 31 is a graph showing a calculation result according to Example 27.

FIG. 31 shows a calculation result according to Example 27 and indicates a displacement in the widthwise direction when the parameters of the IDT electrode are Wi=21.0λ, Wg=15.5λ, and Wb=20.8λ.

Example 28

Figure 32:
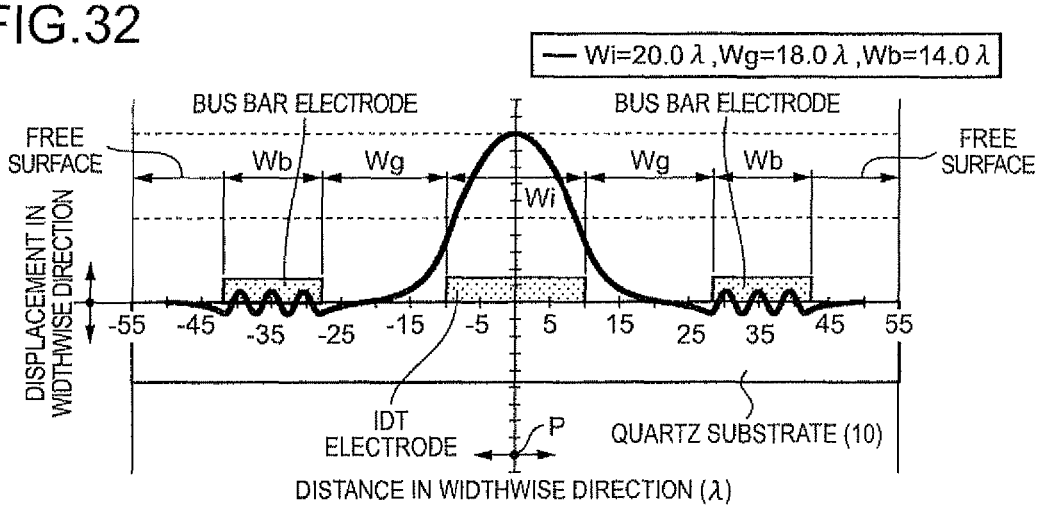
FIG. 32 is a graph showing a calculation result according to Example 28.

FIG. 32 shows a calculation result according to Example 28 and indicates a displacement in the widthwise direction when the parameters of the IDT electrode are Wi=20.0λ, Wg=18.0λ, and Wb=14.0λ.

Example 29

Figure 33:
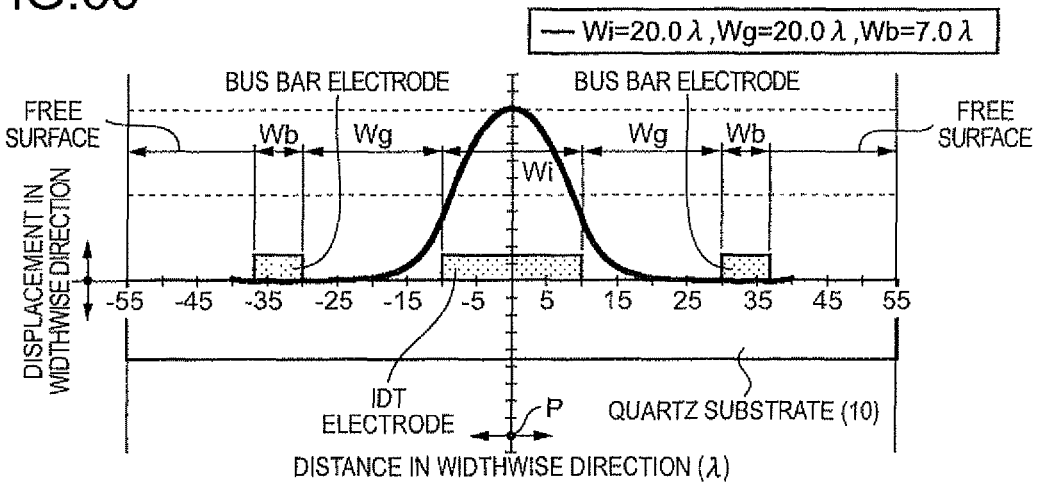
FIG. 33 is a graph showing a calculation result according to Example 29.

FIG. 33 shows a calculation result according to Example 29 and indicates a displacement in the widthwise direction when the parameters of the IDT electrode are Wi=20.0λ, Wg=20.0λ, and Wb=7.0λ.

Example 30

Figure 34:
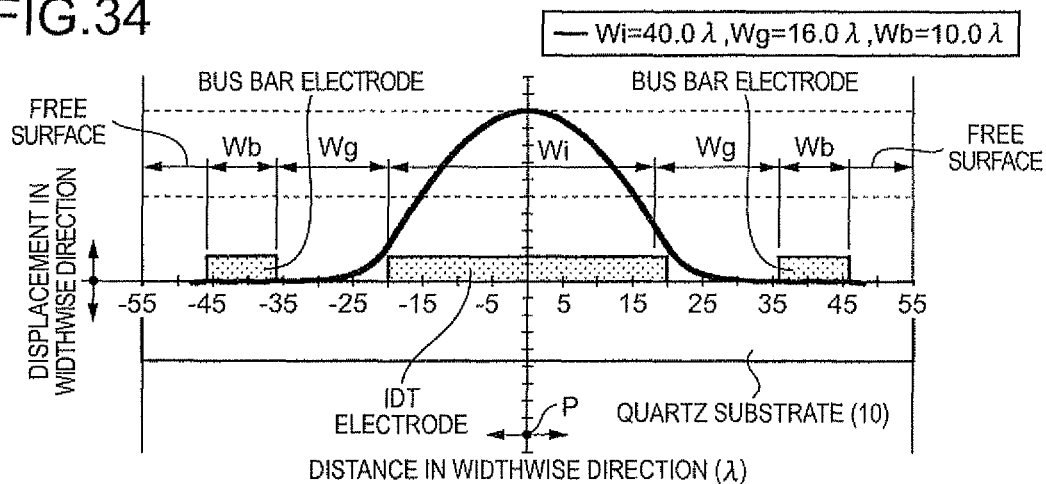
FIG. 34 is a graph showing a calculation result according to Example 30.

FIG. 34 shows a calculation result according to Example 30 and indicates a displacement in the widthwise direction when the parameters of the IDT electrode are Wi=40.0λ, Wg=16.0λ, and Wb=10.0λ.

Example 31

Figure 35:
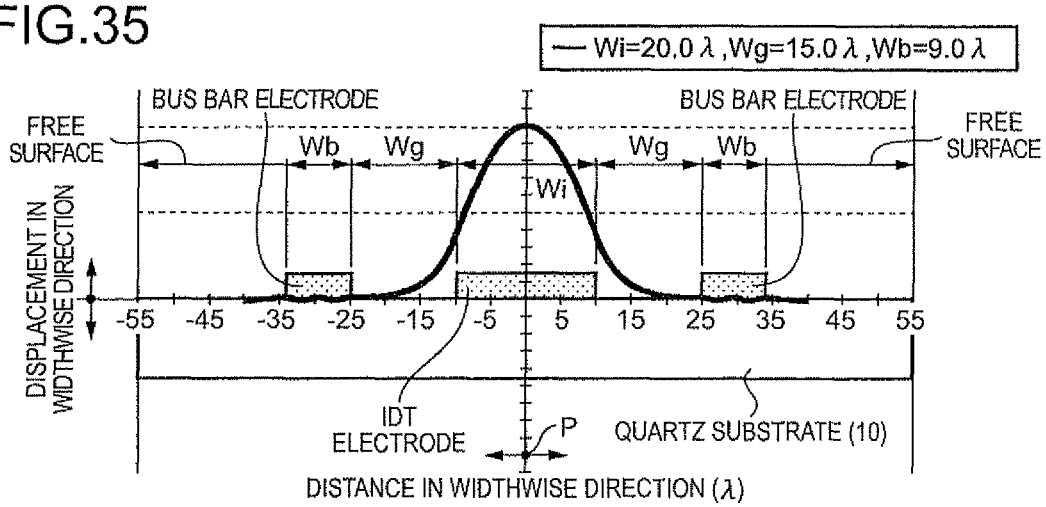
FIG. 35 is a graph showing a calculation result according to Example 31.

FIG. 35 shows a calculation result according to Example 31 and indicates a displacement in the widthwise direction when the parameters of the IDT electrode are Wi=20.0λ, Wg=15.0λ, and Wb=9.0λ.

Example 32

Figure 36:
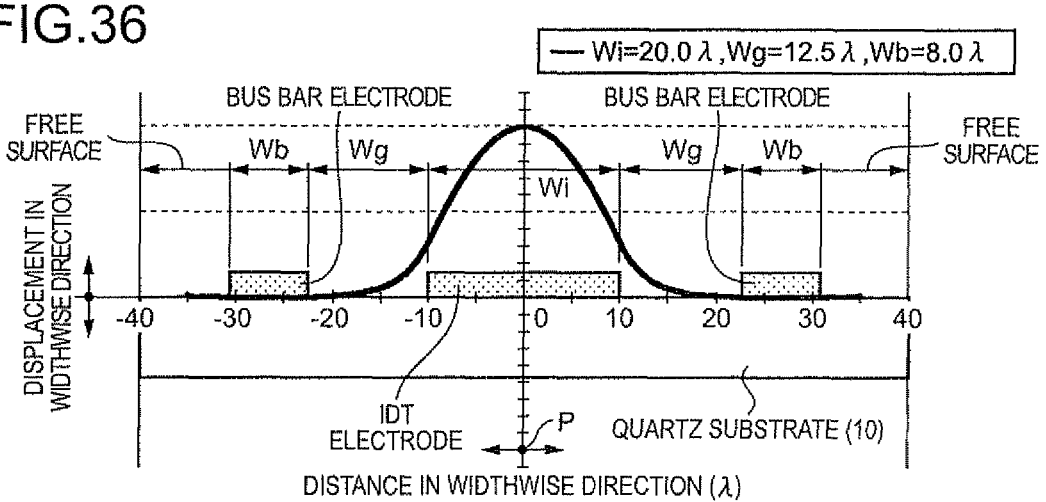
FIG. 36 is a graph showing a calculation result according to Example 32.

FIG. 36 shows a calculation result according to Example 32 and indicates a displacement in the widthwise direction when the parameters of the IDT electrode are Wi=20.0λ, Wg=12.5λ, and Wb=8.0λ.

Example 33

Figure 37:
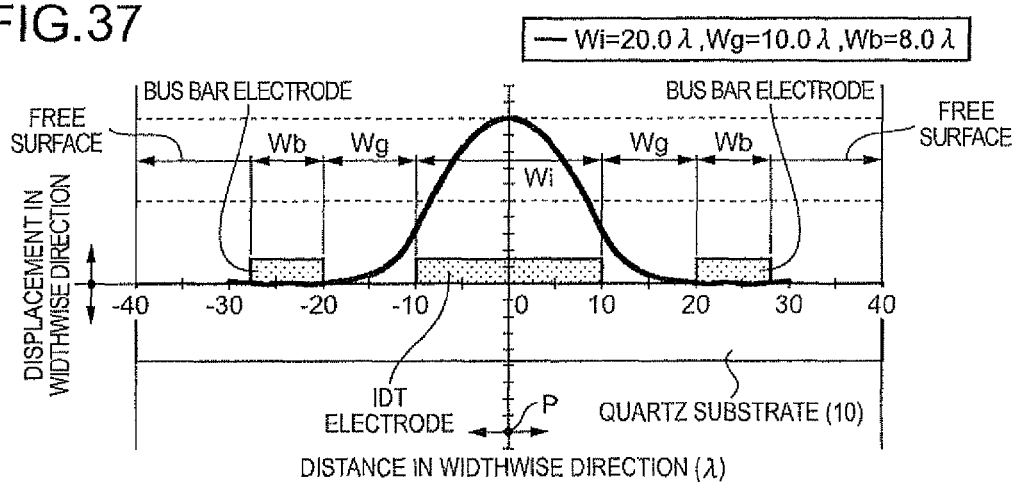
FIG. 37 is a graph showing a calculation result according to Example 33.

FIG. 37 shows a calculation result according to Example 33 and indicates a displacement in the widthwise direction when the parameters of the IDT electrode are Wi=20.0λ, Wg=10.0λ, and Wb=8.0λ.

Example 34

Figure 38:
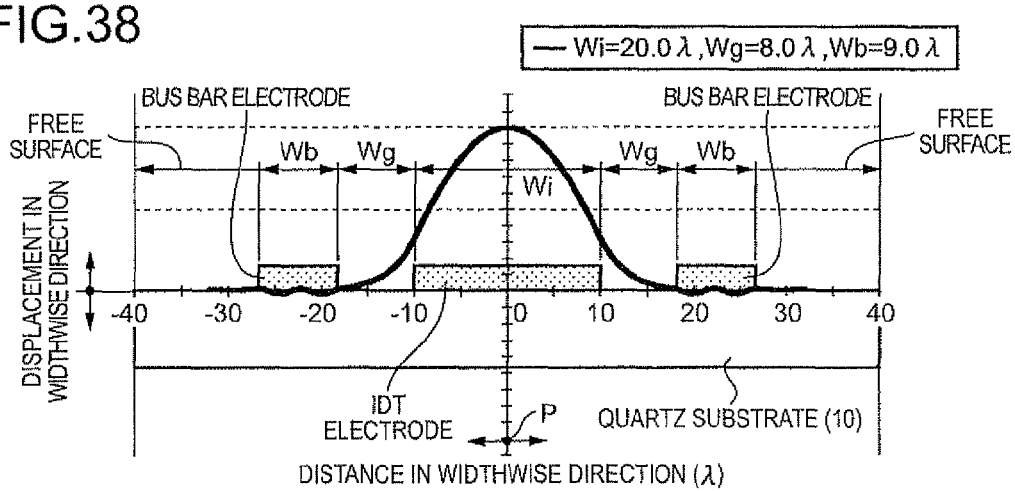
FIG. 38 is a graph showing a calculation result according to Example 34.

FIG. 38 shows a calculation result according to Example 34 and indicates a displacement in the widthwise direction when the parameters of the IDT electrode are Wi=20.0λ, Wg=8.0λ, and Wb=9.0λ.

Example 35

Figure 39:
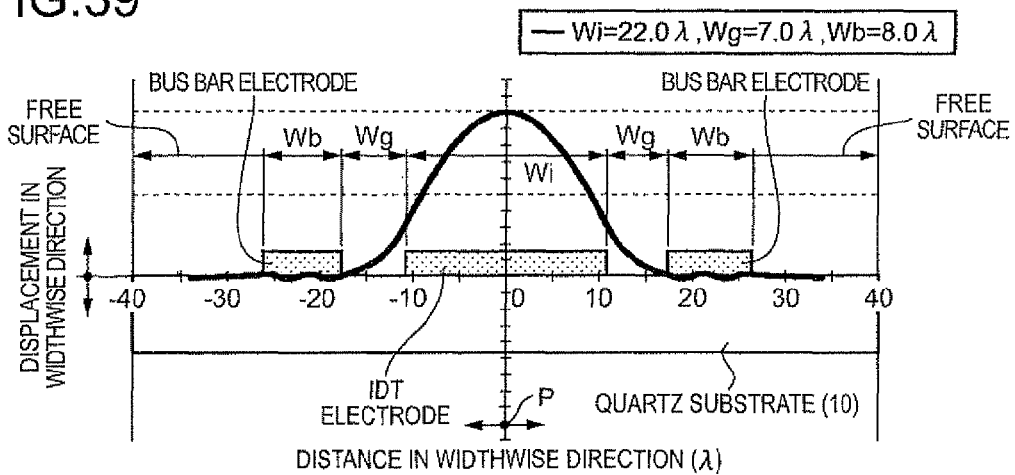
FIG. 39 is a graph showing a calculation result according to Example 35.

FIG. 39 shows a calculation result according to Example 35 and indicates a displacement in the widthwise direction when the parameters of the IDT electrode are Wi=22.0λ, Wg=7.0λ, and Wb=8.0λ.

Example 36

Figure 40:
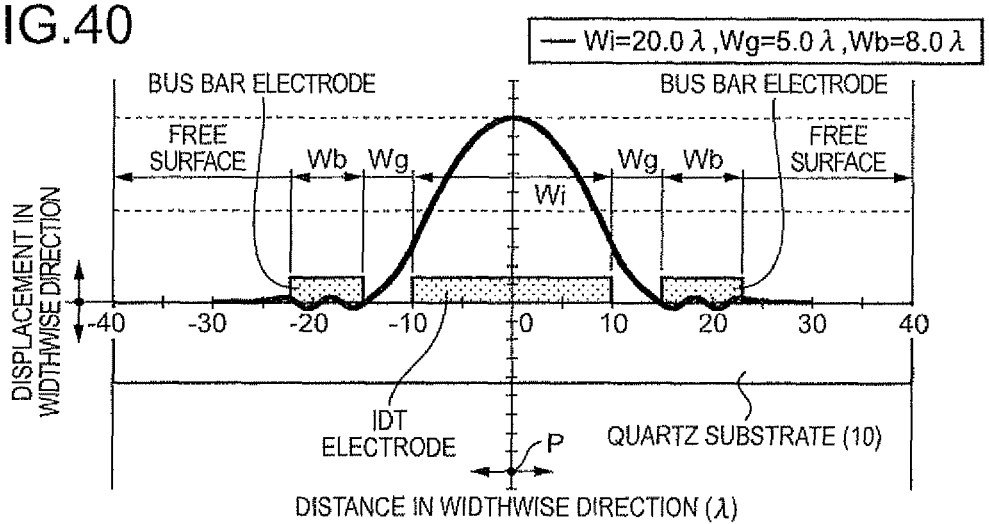
FIG. 40 is a graph showing a calculation result according to Example 36.

FIG. 40 shows a calculation result according to Example 36 and indicates a displacement in the widthwise direction when the parameters of the IDT electrode are Wi=20.0λ, Wg=5.0λ, and Wb=8.0λ.

Example 37

Figure 41:
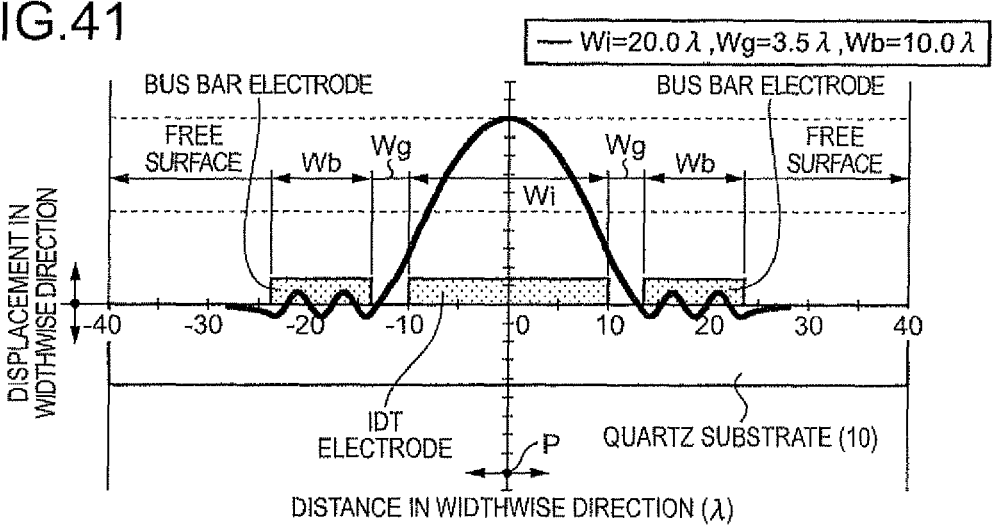
FIG. 41 is a graph showing a calculation result according to Example 37.

FIG. 41 shows a calculation result according to Example 37 and indicates a displacement in the widthwise direction when the parameters of the IDT electrode are Wi=20.0λ, Wg=3.5λ, and Wb=10.0λ.

Example 38

Figure 42:
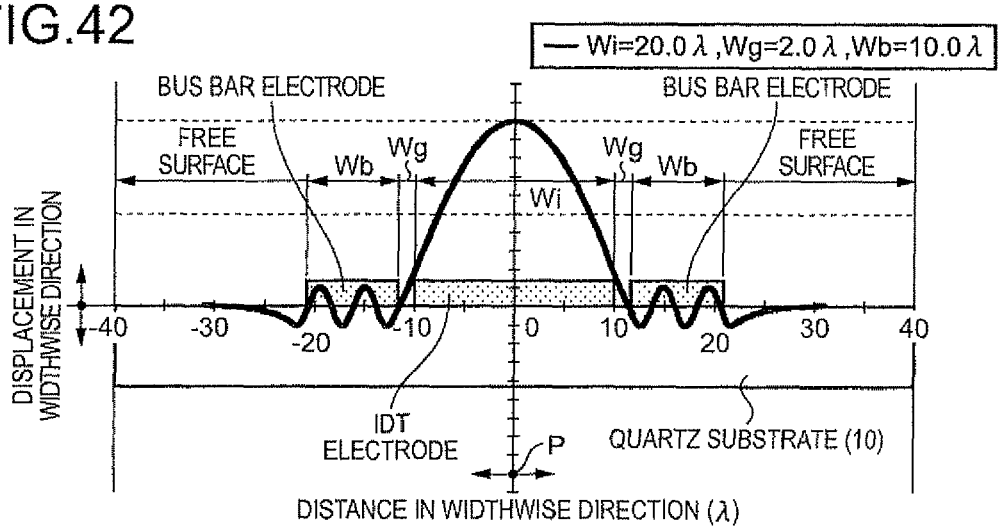
FIG. 42 is a graph showing a calculation result according to Example 38.

FIG. 42 shows a calculation result according to Example 38 and indicates a displacement in the widthwise direction when the parameters of the IDT electrode are Wi=20.0λ, Wg=2.0λ, and Wb=10.0λ.

Example 39

Figure 43:
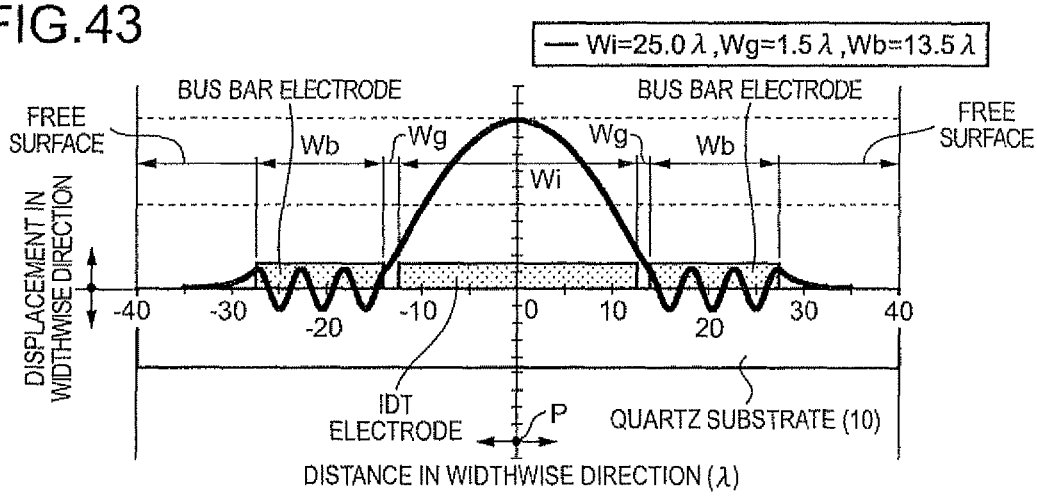
FIG. 43 is a graph showing a calculation result according to Example 39.

FIG. 43 shows a calculation result according to Example 39 and indicates a displacement in the widthwise direction when the parameters of the IDT electrode are Wi=25.0λ, Wg=1.5λ, and Wb=13.5λ.

Example 40

Figure 44:
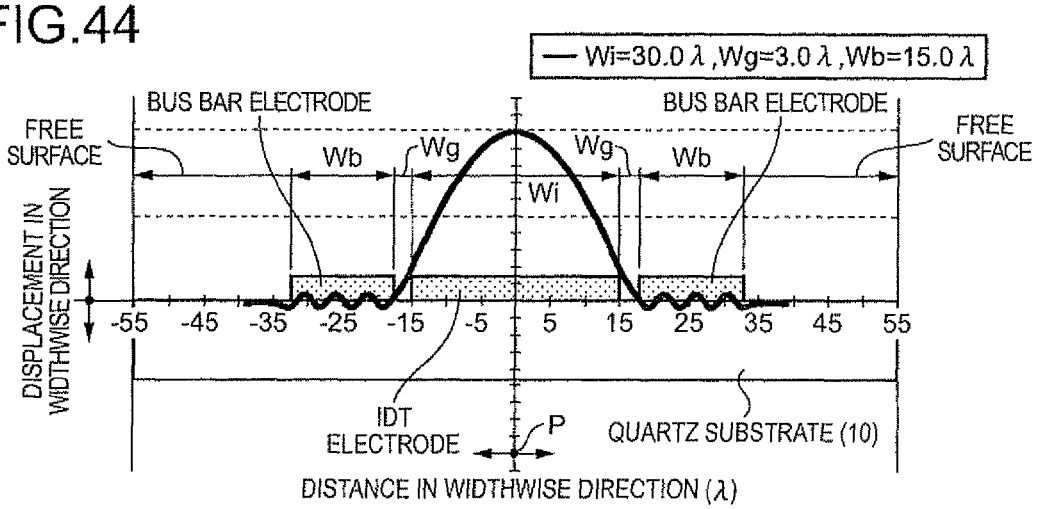
FIG. 44 is a graph showing a calculation result according to Example 40.

FIG. 44 shows a calculation result according to Example 40 and indicates a displacement in the widthwise direction when the parameters of the IDT electrode are Wi=30.0λ, Wg=3.0λ, and Wb=15.0λ.

Example 41

Figure 45:
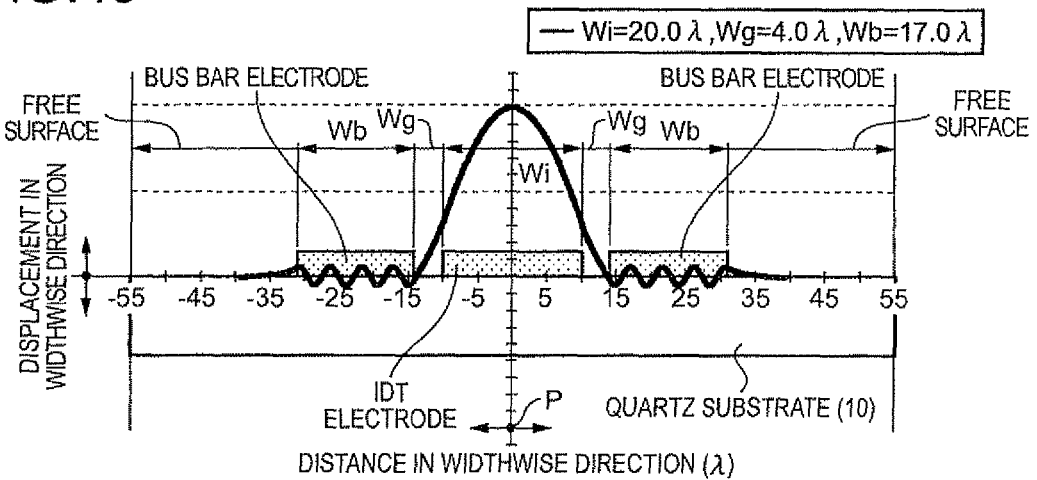
FIG. 45 is a graph showing a calculation result according to Example 41.

FIG. 45 shows a calculation result according to Example 41 and indicates a displacement in the widthwise direction when the parameters of the IDT electrode are Wi=20.0λ, Wg=4.0λ, and Wb=17.0λ.

Example 42

Figure 46:
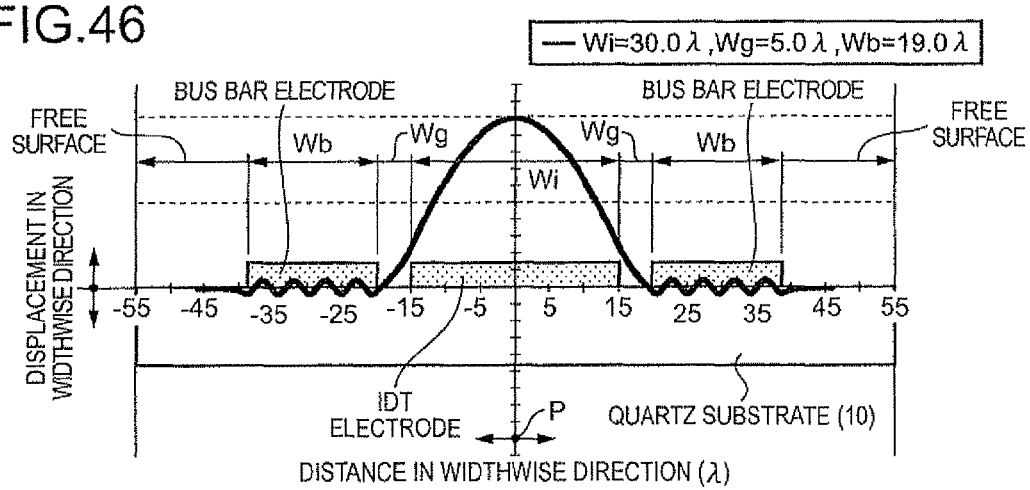
FIG. 46 is a graph showing a calculation result according to Example 42.

FIG. 46 shows a calculation result according to Example 42 and indicates a displacement in the widthwise direction when the parameters of the IDT electrode are Wi=30.0λ, Wg=5.0λ, and Wb=19.0λ.

Example 43

Figure 47:
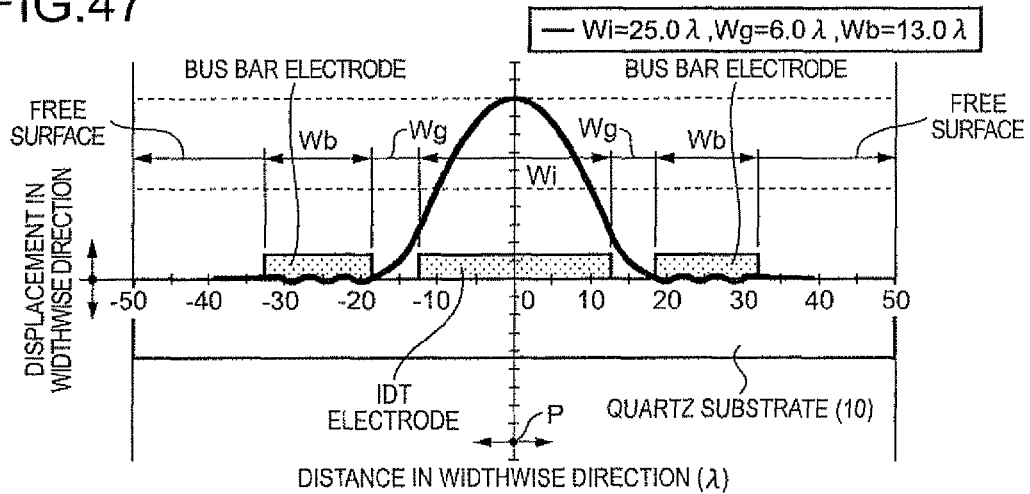
FIG. 47 is a graph showing a calculation result according to Example 43.

FIG. 47 shows a calculation result according to Example 43 and indicates a displacement in the widthwise direction when the parameters of the IDT electrode are Wi=25.0λ, Wg=6.0λ, and Wb=13.0λ.

Example 44

Figure 48:
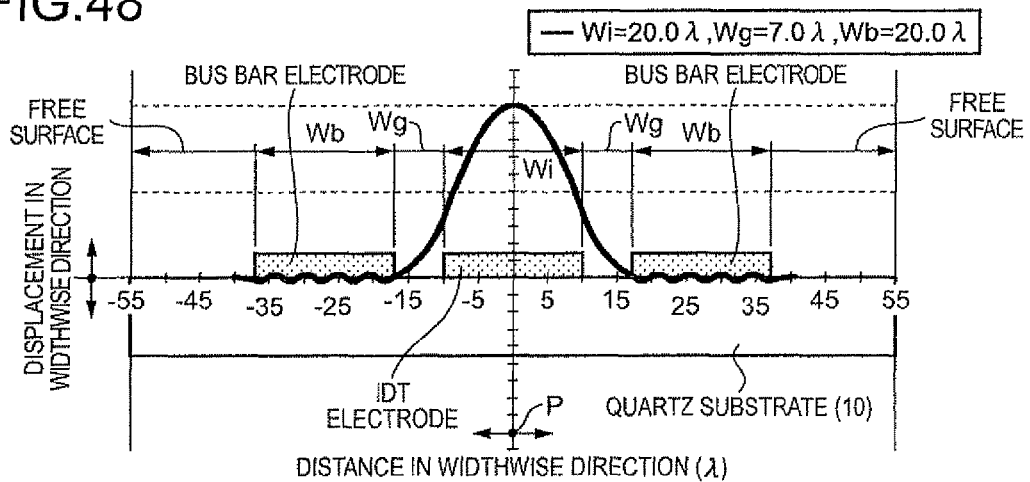
FIG. 48 is a graph showing a calculation result according to Example 44.

FIG. 48 shows a calculation result according to Example 44 and indicates a displacement in the widthwise direction when the parameters of the IDT electrode are Wi=−20.0λ, Wg=7.0λ, and Wb=20.0λ.

Example 45

Figure 49:
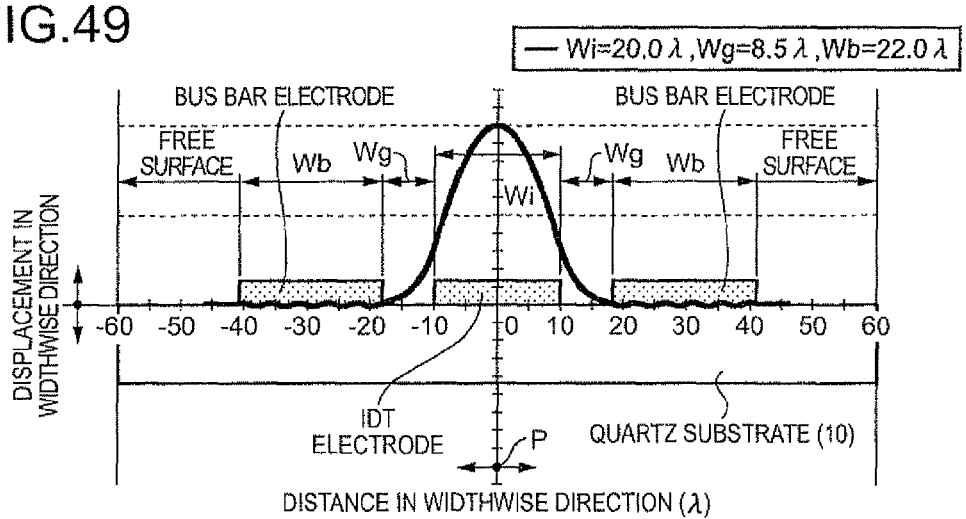
FIG. 49 is a graph showing a calculation result according to Example 45.

FIG. 49 shows a calculation result according to Example 45 and indicates a displacement in the widthwise direction when the parameters of the IDT electrode are Wi=20.0λ, Wg=8.5λ, and Wb=22.0λ.

Example 46

Figure 50:
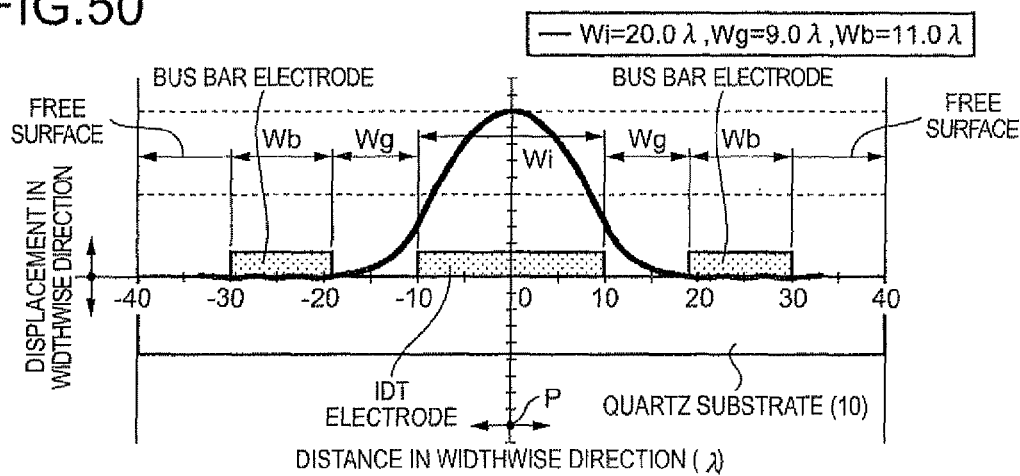
FIG. 50 is a graph showing a calculation result according to Example 46.

FIG. 50 shows a calculation result according to Example 46 and indicates a displacement in the widthwise direction when the parameters of the IDT electrode are Wi=20.0λ, Wg=9.0λ, and Wb=11.0λ.

Example 47

Figure 51:
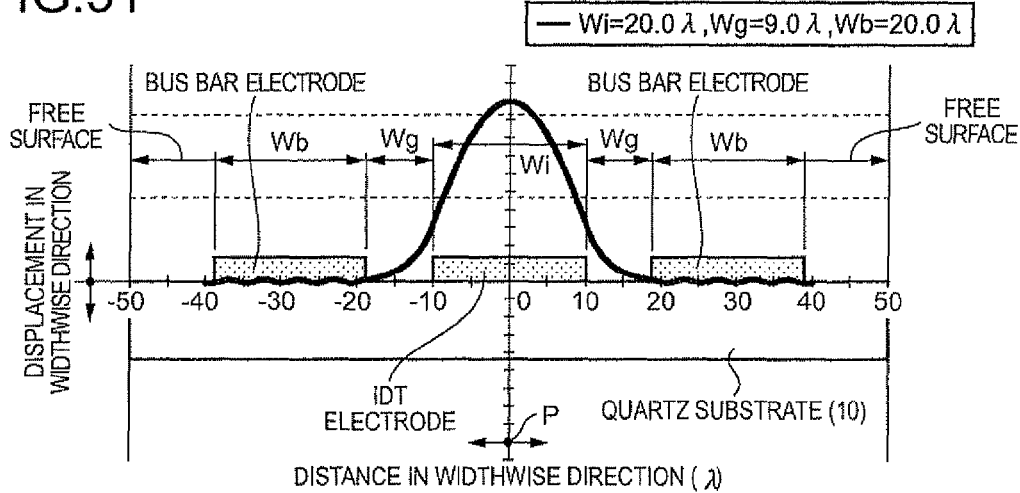
FIG. 51 is a graph showing a calculation result according to Example 47.

FIG. 51 shows a calculation result according to Example 47 and indicates a displacement in the widthwise direction when the parameters of the IDT electrode are Wi=20.0λ, Wg=9.0λ, and Wb=20.0λ.

Example 48

Figure 52:
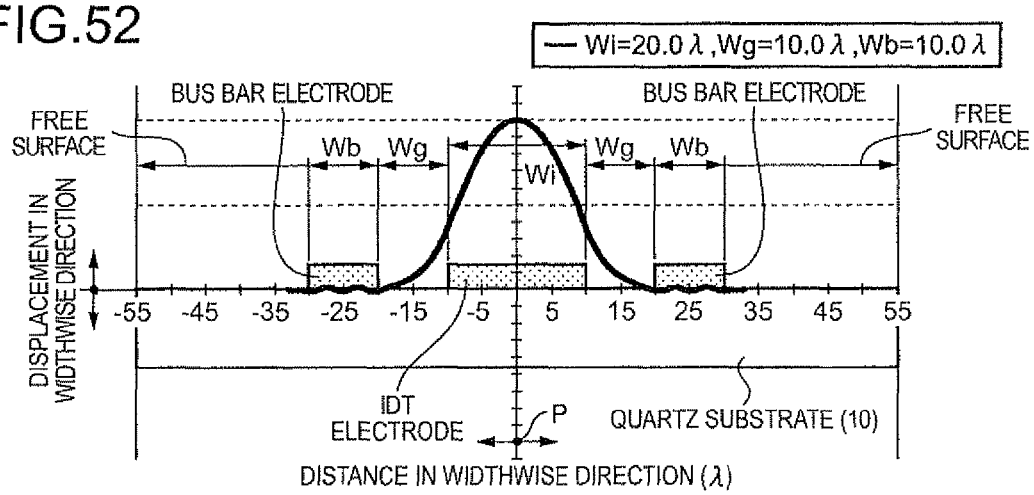
FIG. 52 is a graph showing a calculation result according to Example 48.

FIG. 52 shows a calculation result according to Example 48 and indicates a displacement in the widthwise direction when the parameters of the IDT electrode are Wi=20.0λ, Wg=10.0λ, and Wb=10.0λ.

Example 49

Figure 53:
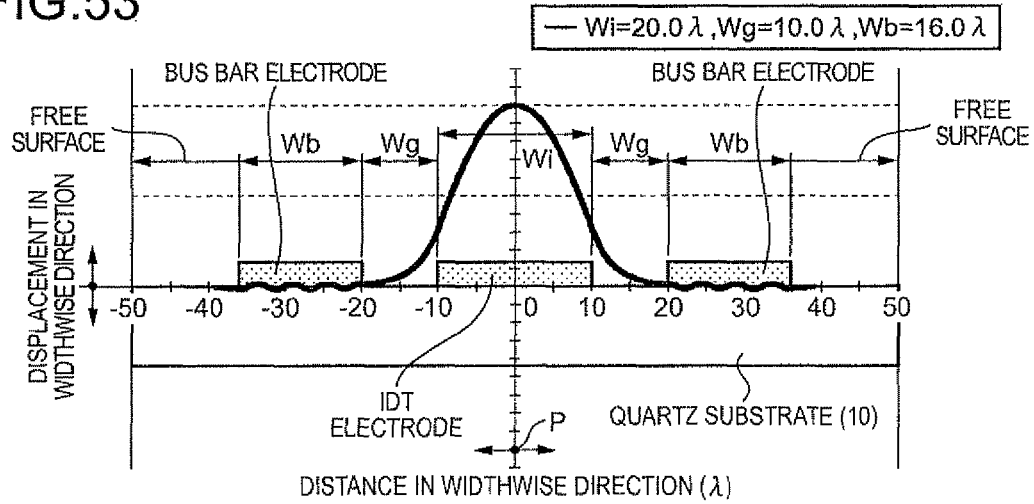
FIG. 53 is a graph showing a calculation result according to Example 49.

FIG. 53 shows a calculation result according to Example 49 and indicates a displacement in the widthwise direction when the parameters of the IDT electrode are Wi=20.0λ, Wg=10.0λ, and Wb=16.0λ.

Example 50

Figure 54:
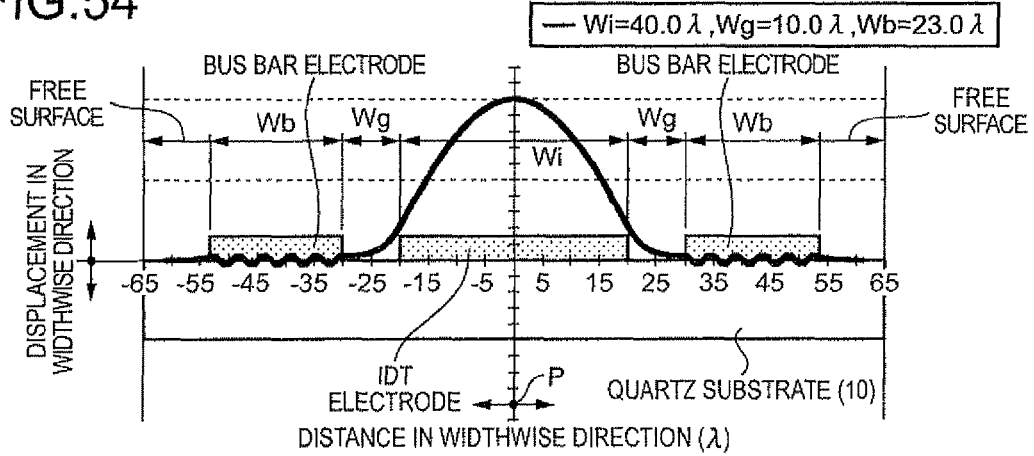
FIG. 54 is a graph showing a calculation result according to Example 50.

FIG. 54 shows a calculation result according to Example 50 and indicates a displacement in the widthwise direction when the parameters of the IDT electrode are Wi=40.0λ, Wg=10.0λ, and Wb=23.0λ.

Example 51

Figure 55:
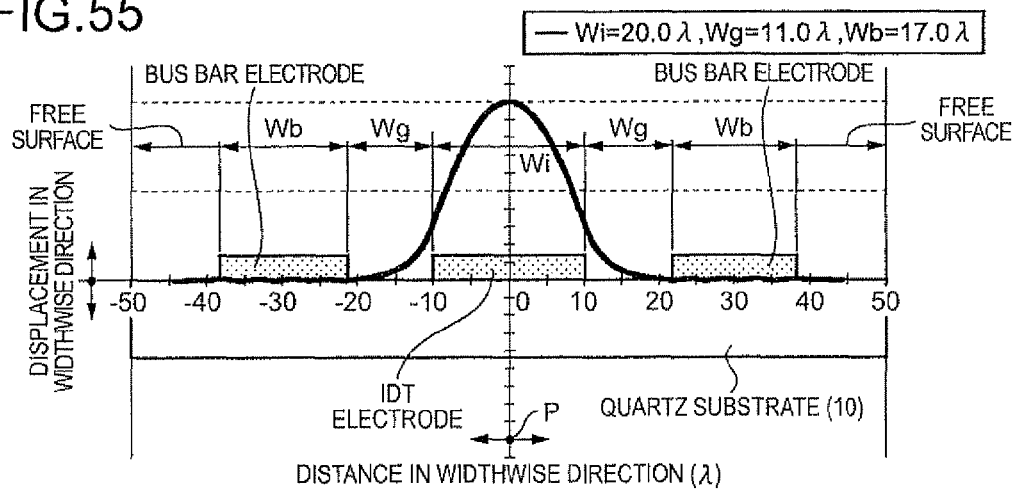
FIG. 55 is a graph showing a calculation result according to Example 51.

FIG. 55 shows a calculation result according to Example 51 and indicates a displacement in the widthwise direction when the parameters of the IDT electrode are Wi=20.0λ, Wg=11.0λ, and Wb=17.0λ.

Example 52

Figure 56:
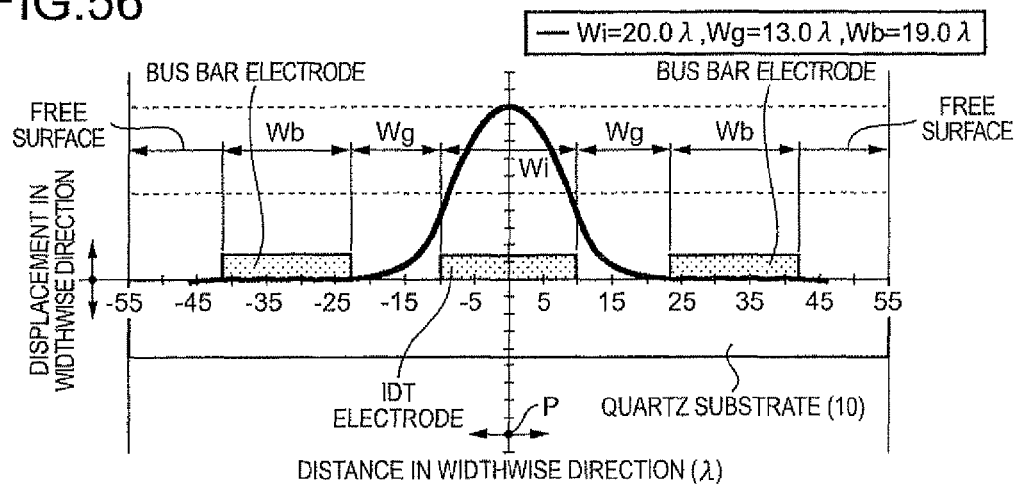
FIG. 56 is a graph showing a calculation result according to Example 52.

FIG. 56 shows a calculation result according to Example 52 and indicates a displacement in the widthwise direction when the parameters of the IDT electrode are Wi=20.0λ, Wg=13.0λ, and Wb=19.0λ.

Example 53

Figure 57:
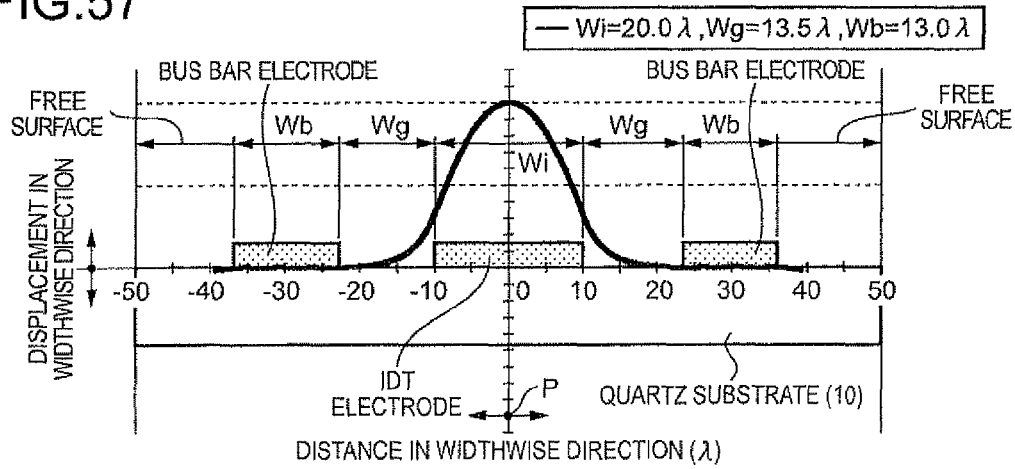
FIG. 57 is a graph showing a calculation result according to Example 53.

FIG. 57 shows a calculation result according to Example 53 and indicates a displacement in the widthwise direction when the parameters of the IDT electrode are Wi=20.0λ, Wg=13.5λ, and Wb=13.0λ.

Example 54

Figure 58:
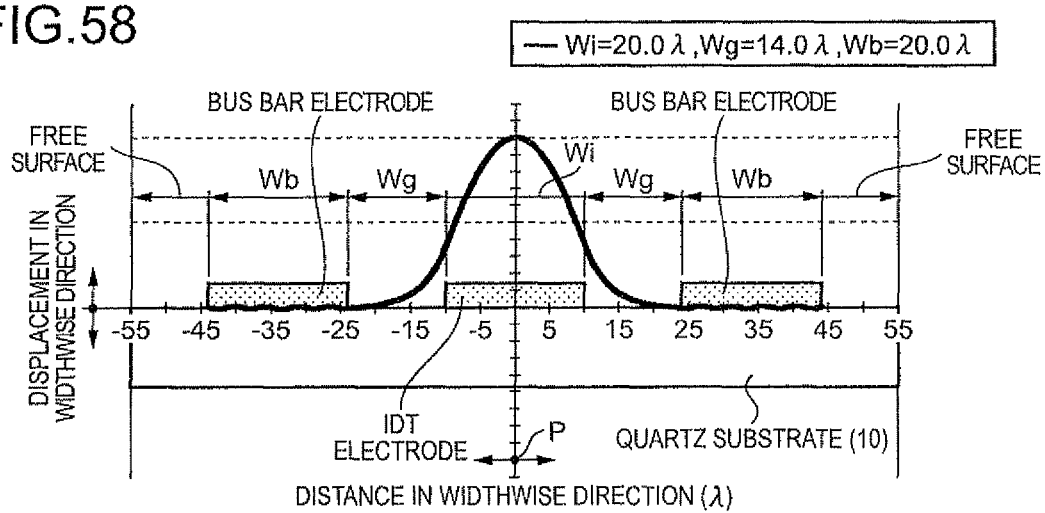
FIG. 58 is a graph showing a calculation result according to Example 54.

FIG. 58 shows a calculation result according to Example 54 and indicates a displacement in the widthwise direction when the parameters of the IDT electrode are Wi=20.0λ, Wg=14.0λ, and Wb=20.0λ.

According to Examples 22 through 54, a vibration leakage occurs in the area of the bus bar electrodes although the size of the vibration leakage varies. However, the displacement converges on the free surfaces from the outer edges of the bus bar electrodes to the outer edges of the quartz substrate.

Example 55

Figure 59:
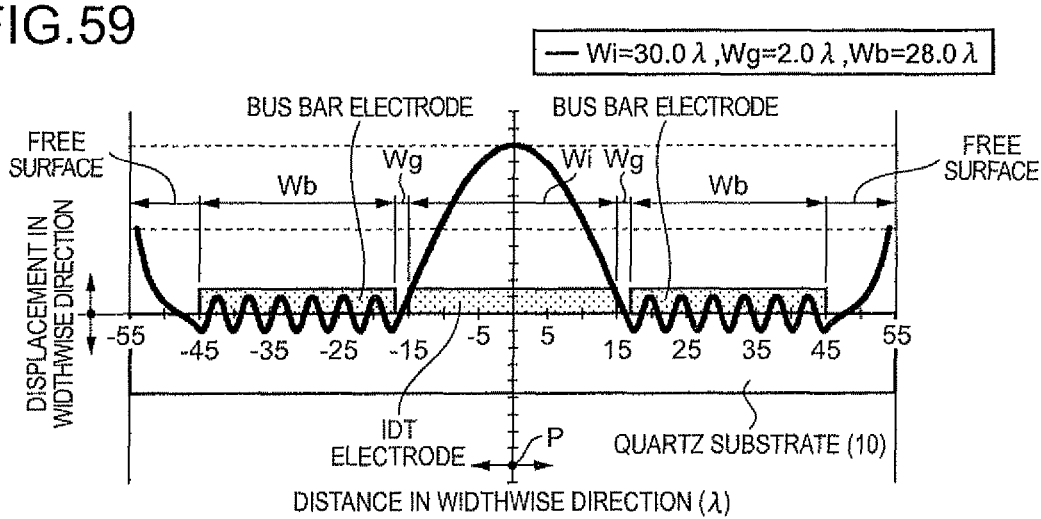
FIG. 59 is a graph showing a calculation result according to Example 55.

FIG. 59 shows a calculation result according to Example 55 and indicates a displacement in the widthwise direction when the parameters of the IDT electrode are Wi=30.0λ, Wg=2.0λ, and Wb=28.0λ.

Example 56

Figure 60:
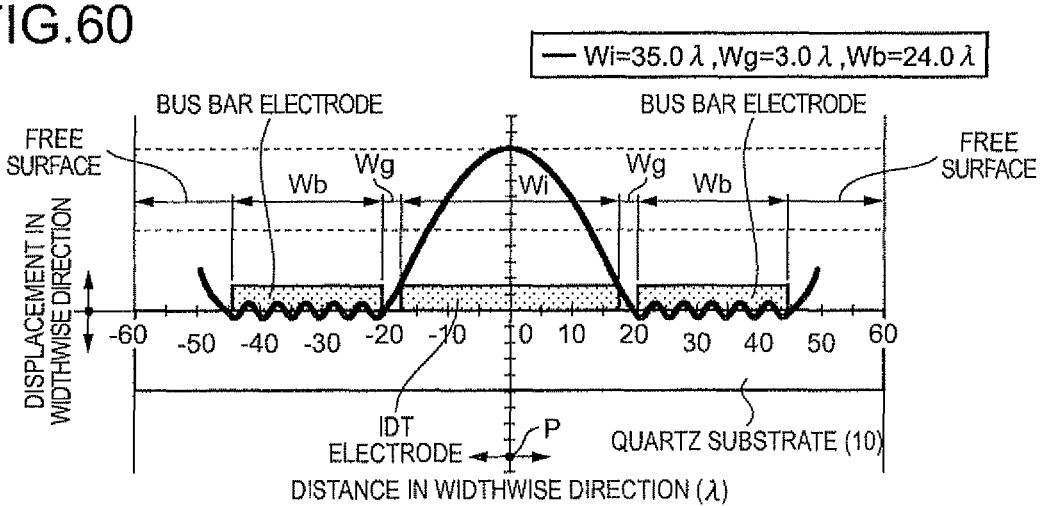
FIG. 60 is a graph showing a calculation result according to Example 56.

FIG. 60 shows a calculation result according to Example 56 and indicates a displacement in the widthwise direction when the parameters of the IDT electrode are Wi=35.0λ, Wg=3.0λ, and Wb=24.0λ.

Example 57

Figure 61:
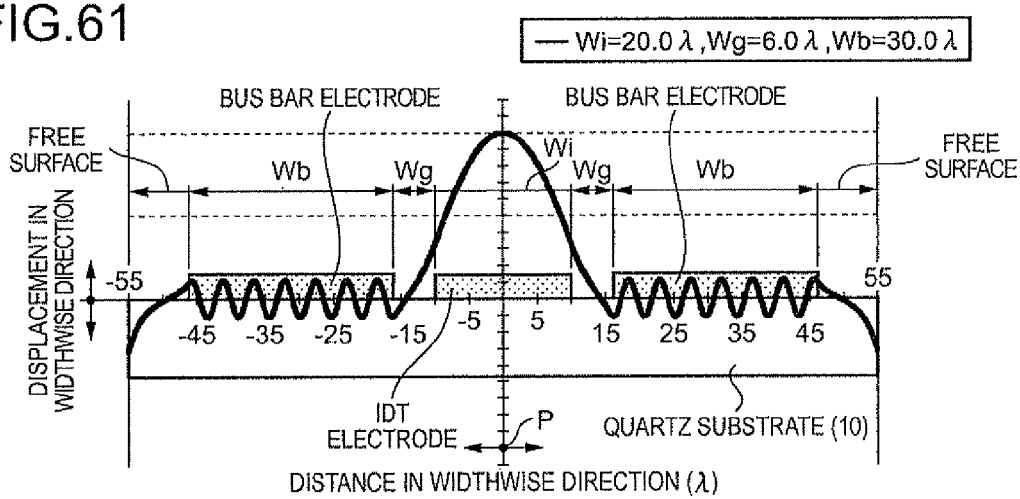
FIG. 61 is a graph showing a calculation result according to Example 57.

FIG. 61 shows a calculation result according to Example 57 and indicates a displacement in the widthwise direction when the parameters of the IDT electrode are Wi=20.0λ, Wg=6.0λ, and Wb=30.0λ.

Example 58

Figure 62:
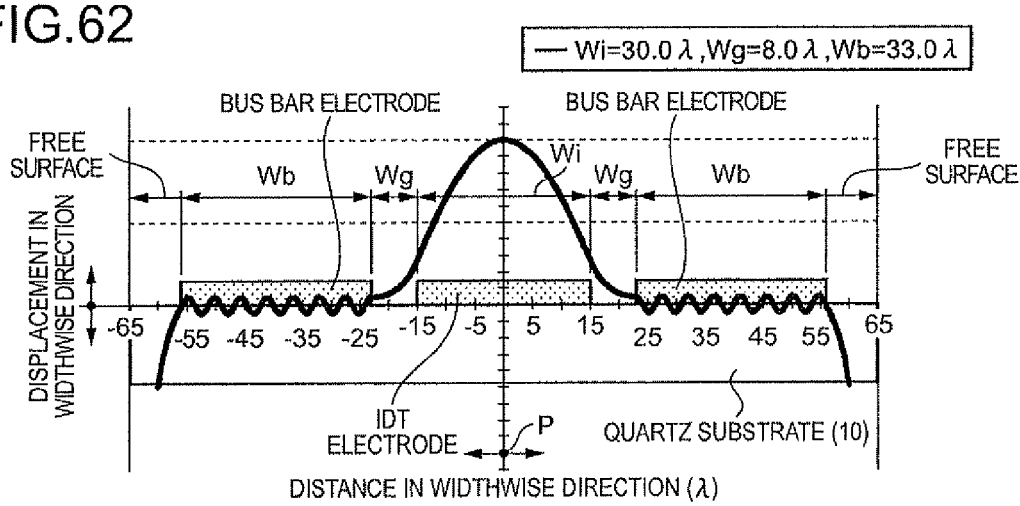
FIG. 62 is a graph showing a calculation result according to Example 58.

FIG. 62 shows a calculation result according to Example 58 and indicates a displacement in the widthwise direction when the parameters of the IDT electrode are Wi=30.0λ, Wg=8.0λ, and Wb=33.0λ.

Example 59

Figure 63:
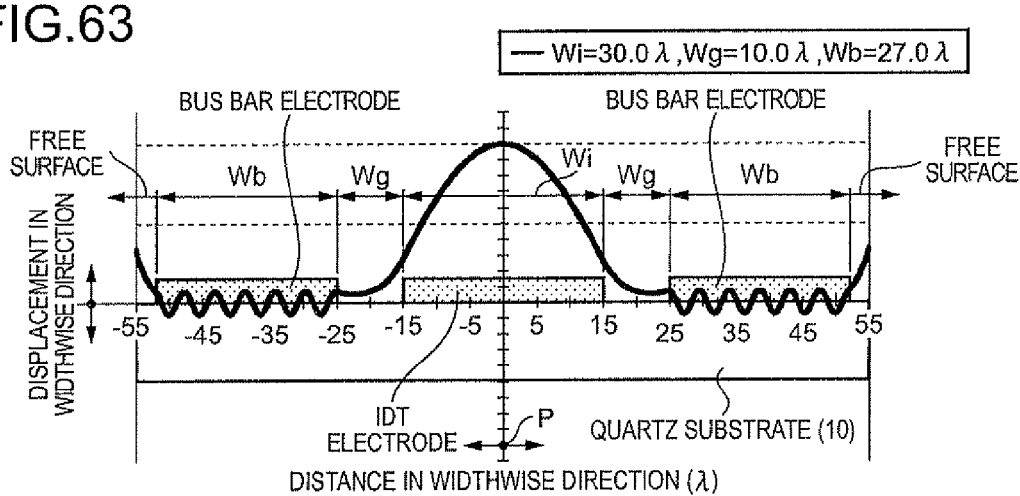
FIG. 63 is a graph showing a calculation result according to Example 59.

FIG. 63 shows a calculation result according to Example 59 and indicates a displacement in the widthwise direction when the parameters of the IDT electrode are Wi=30.0λ, Wg=10.0λ, and Wb=27.0λ.

Example 60

Figure 64:
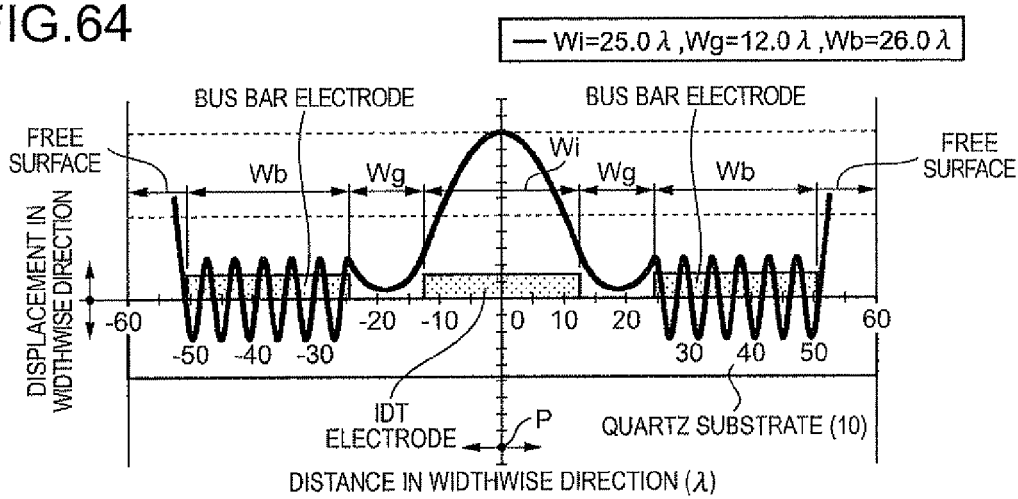
FIG. 64 is a graph showing a calculation result according to Example 60.

FIG. 64 shows a calculation result according to Example 60 and indicates a displacement in the widthwise direction when the parameters of the IDT electrode are Wi=25.0λ, Wg=12.0λ, and Wb=26.0λ.

Example 61

Figure 65:
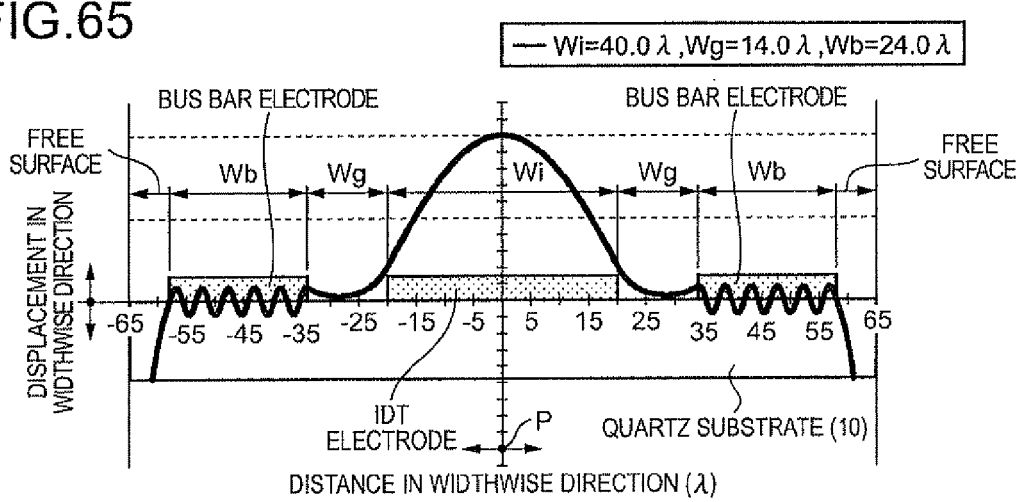
FIG. 65 is a graph showing a calculation result according to Example 61.

FIG. 65 shows a calculation result according to Example 61 and indicates a displacement in the widthwise direction when the parameters of the IDT electrode are Wi=40.0λ, Wg=14.0λ, and Wb=24.0λ.

Example 62

Figure 66:
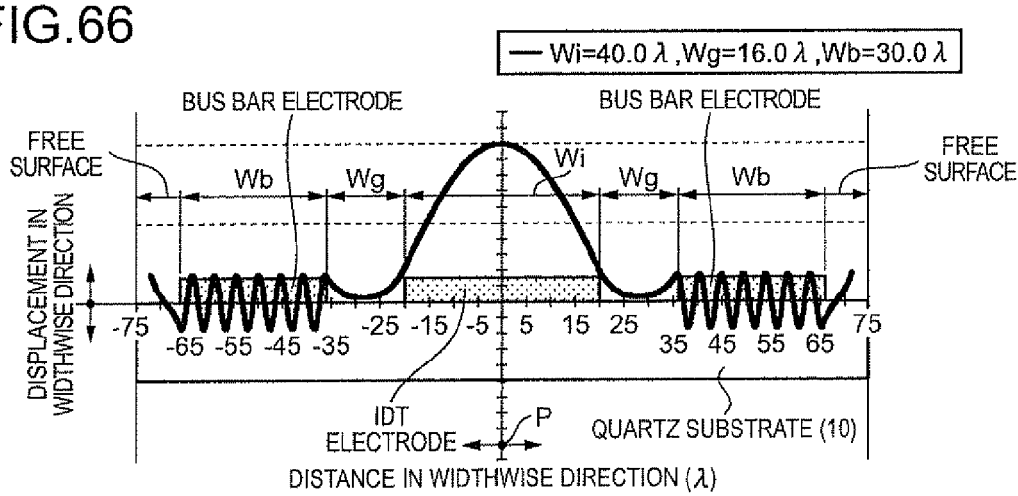
FIG. 66 is a graph showing a calculation result according to Example 62.

FIG. 66 shows a calculation result according to Example 62 and indicates a displacement in the widthwise direction when the parameters of the IDT electrode are Wi=40.0λ, Wg=16.0λ, and Wb=30.0λ.

Example 63

Figure 67:
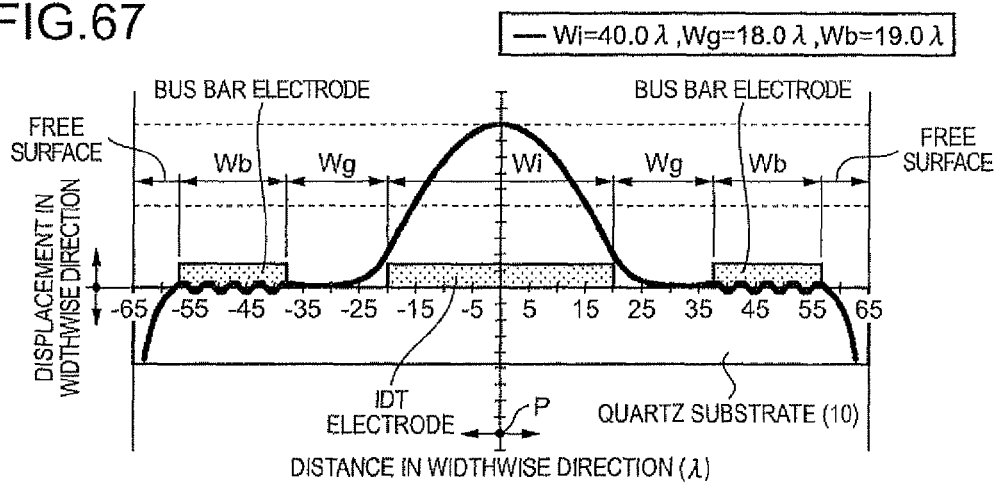
FIG. 67 is a graph showing a calculation result according to Example 63.

FIG. 67 shows a calculation result according to Example 63 and indicates a displacement in the widthwise direction when the parameters of the IDT electrode are Wi=40.0λ, Wg=18.0λ, and Wb=19.0λ.

Example 64

Figure 68:
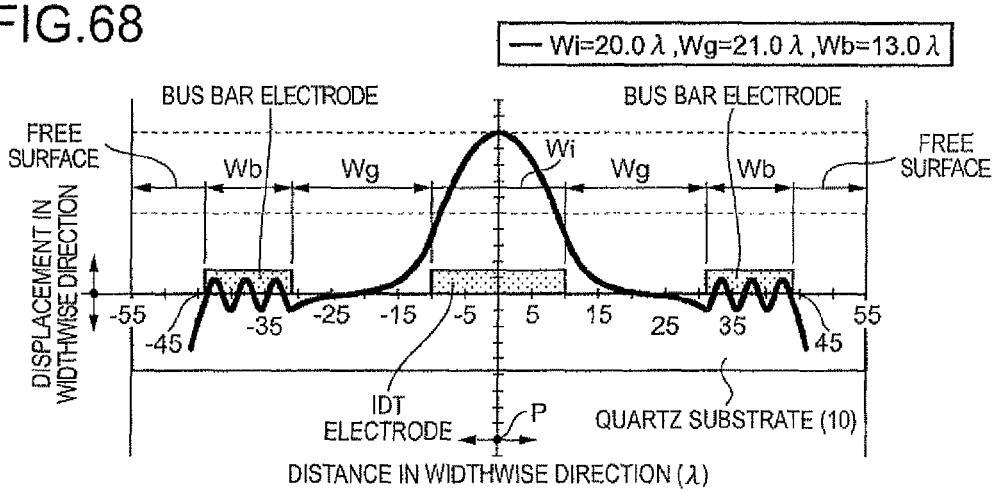
FIG. 68 is a graph showing a calculation result according to Example 64.

FIG. 68 shows a calculation result according to Example 64 and indicates a displacement in the widthwise direction when the parameters of the IDT electrode are Wi=20.0λ, Wg=21.0λ, and Wb=13.0λ.

Example 65

Figure 69:
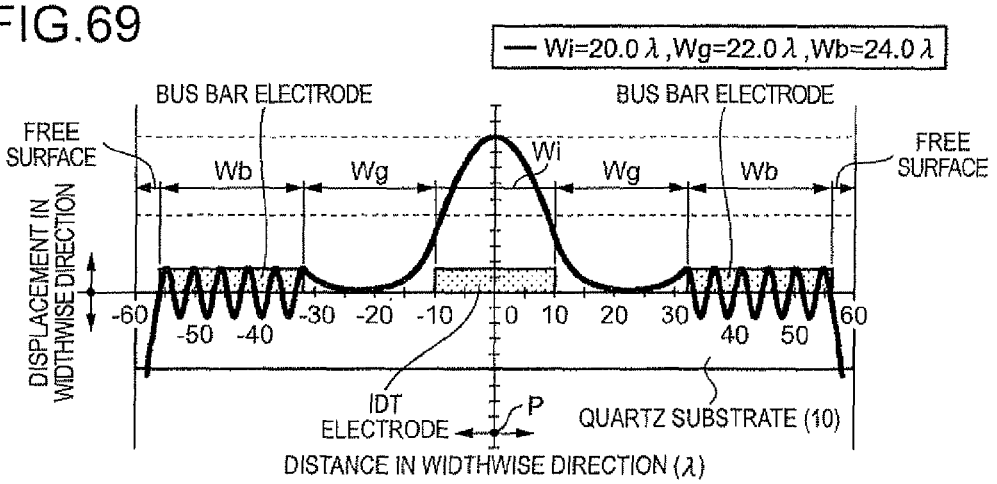
FIG. 69 is a graph showing a calculation result according to Example 65.

FIG. 69 shows a calculation result according to Example 65 and indicates a displacement in the widthwise direction when the parameters of the IDT electrode are Wi=20.0λ, Wg=22.0λ, and Wb=24.0λ.

Example 66

Figure 70:
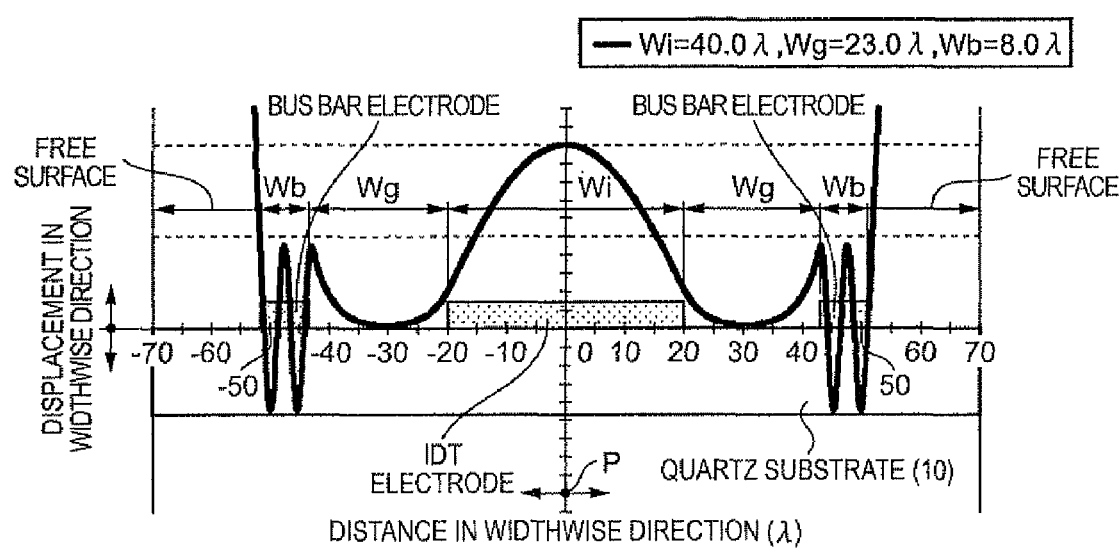
FIG. 70 is a graph showing a calculation result according to Example 66.

FIG. 70 shows a calculation result according to Example 66 and indicates a displacement in the widthwise direction when the parameters of the IDT electrode are Wi=40.0λ, Wg=23.0λ, and Wb=8.0λ.

In Examples 55 to 66 above, the displacements are the largest at the center of the IDT electrode similarly to Examples 1 to 54. However, the displacements in the widthwise direction are large on the free surfaces from the outer edges of the bus bar electrodes to the outer edges of the quartz substrate. That is, this indicates that energy is not trapped because a vibration leakage occurs.

The displacements in the widthwise direction in Examples 1 to 66 described above are shown together in a diagram and explained.

FIG. 71 is an explanatory diagram showing if the displacements in the widthwise direction according to combinations of parameters of the IDT electrodes in Examples 1 to 66 converge or not. Examples by the combination that results in convergence are indicated in a symbol "O", while Examples by the combination that results in non-convergence are indicated in a symbol "X"). Examples 1, 2, ... are represented as J1, J2, ....

As illustrated in FIGS. 5 to 12, in the combinations in Examples 1 (J1) to 8 (J8), the displacements in the widthwise direction converge or tend to converge. On the other hand, in the combinations in Examples 9 (J9) to 20 (J20), the displacements in the widthwise direction do not converge.

In FIG. 71, in illustrated combinations A to G, the displacements in the widthwise direction converge although their individual illustrations according to Examples are omitted. Therefore, these combinations A to G are regarded as a border between a region in which the displacement converges and a region in which the displacement does not converge.

A curve connecting the combinations A to G approximates a circular arc R represented by an equation of a circle $(x-10)^2+(y+12.7)^2=19^2$ for both the distance Wg and the width Wb in an orthogonal coordinate when the distance Wg from the electrode finger elements to the bus bar electrode is indicated as an x axis, and the width Wb of the bus bar electrode is indicated as a y axis. Therefore, the combinations shown in Examples 1 to 8 (J1 to J8 in the figure) are indicated in a range of optimum electrode design conditions in which the displacement in the widthwise direction converges on the free surfaces (a vibration leakage can be suppressed). Therefore, when the electrode is designed within the range, the vibration leakage in the widthwise direction can be suppressed.

Further, as illustrated in FIGS. 25 to 58, in Examples 21 (J21) to 54 (J54), the displacements in the widthwise direction converge or tend to converge. On the other hand, in Examples 55 (J55) to 66 (J66) illustrated in FIGS. 59 to 70, the displacements in the widthwise direction do not converge.

According to the combinations of respective parameters of J21 to J51 shown in FIG. 71, when a coordinate is represented as (Wg, Wb), coordinates of J21(1.0, 7.0), J22(1.0, 20.0), J23(2.0, 21.0), J24(4.5, 22.5), J25(7.5, 25.0), J26(12.0, 23.0), J27(15.5, 20.8), J28(18.0, 14.0), J29(20.0, 7.0), J30(16.0, 10.0), J31(15.0, 9.0), J32(12.5, 8.0), J33(10.0, 8.0), J34(8.0, 9.0), J35(7.0, 8.0), J36(5.0, 8.0), J37(3.5, 10.0), J38(2.0, 10.0), J21(1.0, 7.0) are connected by a straight line in this order. Then, in a range surrounded by the line, the displacement in the widthwise direction converges or tends to converge, and a spurious is suppressed. Resulting from this, a high Q value, and a low CI value are realized.

Further, energy trapping in the lengthwise direction (X direction: the propagation direction of the Lamb wave) is realized by forming the reflectors 25 and 26 with the number of electrodes. Furthermore, when the distance Wg from the electrode finger elements to the bus bar electrode, and the width Wb of the bus bar electrode are in the range of the optimum electrode design conditions as described above, energy trapping in the widthwise direction is achieved. As a result, a high Q value, and a low CI value are realized.

If the distance Wg from the electrode finger elements to the bus bar electrode is smaller than 1λ, interference of a small foreign object during a photolithography process for forming electrodes may cause a short circuit and it is considered that this may decrease a production yield. Therefore, it is preferable that the distance Wg be 1λ or more. Further, if the width Wb of the bus bar electrode is thinner than 1λ, interference of a small foreign object during an operation of the photolithography process may cause disconnections to the electrode finger elements since tens of them are aligned and electrically coupled to each other. It is considered that this may decrease the production yield. Therefore, it is preferable that the width Wb be 1λ or more.

Therefore, as shown in FIG. 71, the thickness t of the quartz substrate 10 is in a range expressed by $0 \leq t/\lambda \leq 3$, Further, when both the width Wb of the bus bar electrode, and the distance Wg (unit: λ) from the electrode finger elements to the bus bar electrode are in the range of a circular arc R represented by the equation of the circle $(x-10)^2+(y+12.7)^2=19^2$ and the range satisfying $Wg \geq 1\lambda$, and $Wb \geq 1\lambda$ in the orthogonal coordinate when the distance Wg is indicated as the x axis, and the width Wb is indicated as the y axis, energy trapping in the widthwise direction is achieved.

Second Embodiment

Subsequently, in the Lamb-wave resonator 1 (refer to FIGS. 2 and 3) described above, calculation results obtained by simulations of relations of frequency temperature deviation (frequency temperature variation), a phase velocity, and an electromechanical coupling coefficient $K^2$ with respect to a phase velocity, a standardized substrate thickness t/λ, and an angle θ of Euler angle (0, θ, 0) will be described with reference to drawings.

In the second embodiment, a cut angle of the quartz substrate 10 is set at $\phi=0$ degrees and $\psi=\pm 5$ degrees.

Figure 72:
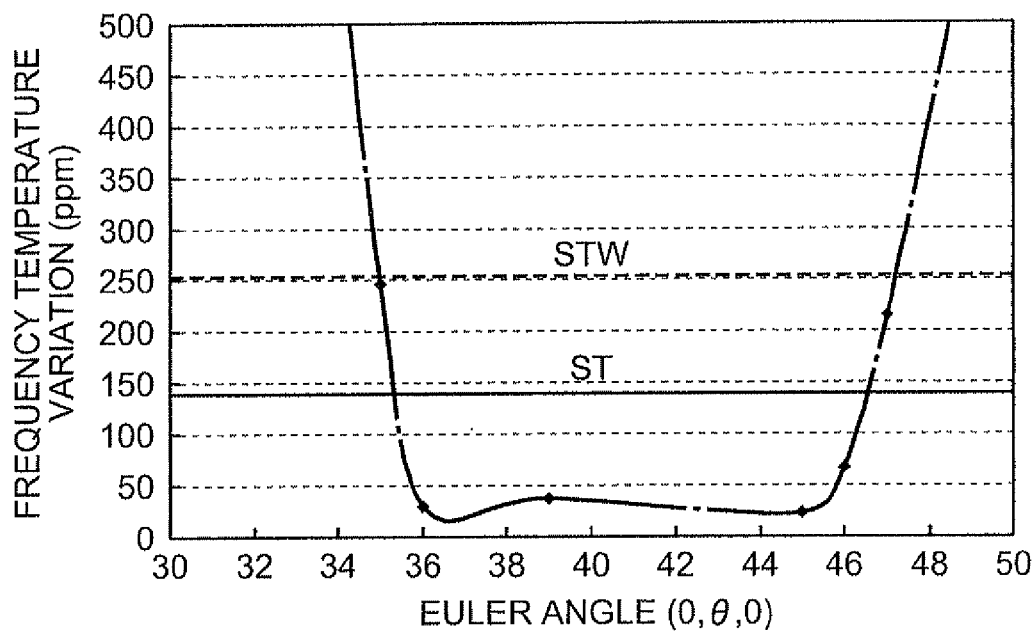
FIG. 72 is a graph showing a relation between frequency temperature variation and an angle $\theta$ of Euler angle $(0, \theta, 0)$.

FIG. 72 is a graph showing the relation between frequency temperature variation and the angle θ of the Euler angle (0, θ, 0). FIG. 72 shows that a range of the angle θ for the Lamb-wave resonator 1 using the quartz substrate 10 of the embodiment when a better frequency temperature characteristic than that of STW cut quartz crystal is obtained is 35 degrees $\leq \theta \leq 47.2$ degrees.

Further, the angle θ of the quartz substrate 10 is preferably 36 degrees $\leq \theta \leq 45$ degrees. In a region of the angle θ, the frequency temperature variation is almost flat, and exhibits a frequency temperature characteristics superior to ST cut quartz crystal.

Figure 73:
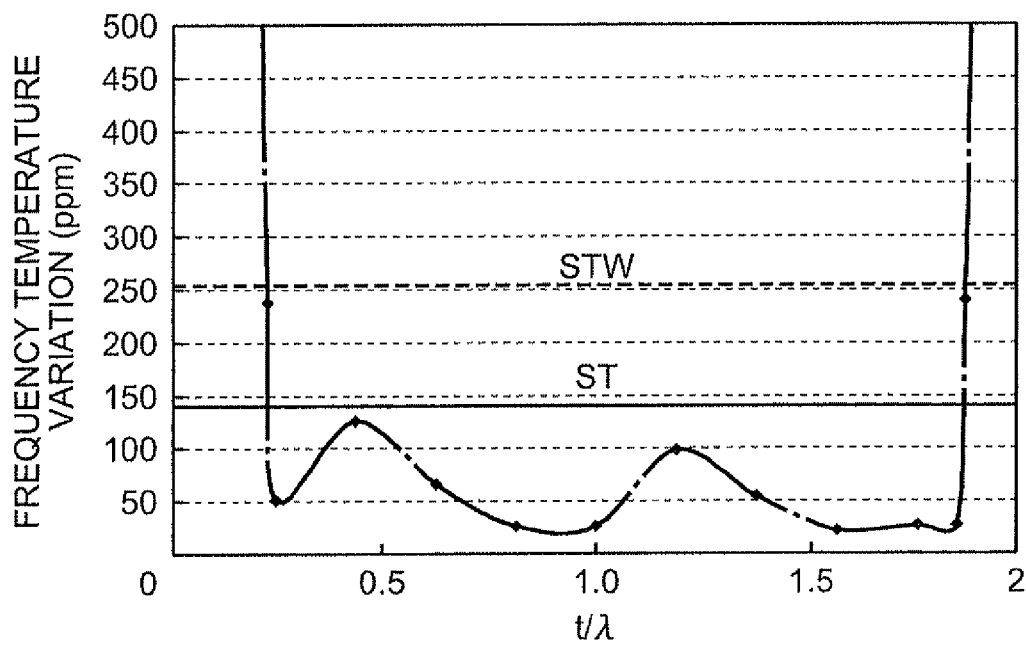
FIG. 73 is a graph showing a relation between the frequency temperature variation and the standardized substrate thickness $t/\lambda$.

FIG. 73 is a graph showing the relation between the frequency temperature variation and the standardized substrate thickness t/λ. As shown in FIG. 73, when the standardized substrate thickness t/λ is in a range of $0.176 \leq t/\lambda \leq 1.925$, a frequency temperature characteristic superior to STQ cut quartz crystal and the ST cut quartz crystal is obtained.

Next, the mutual relation of the angle θ, and the standardized substrate thickness t/λ with respect to the phase velocity, the frequency temperature variation, and the electromechanical coupling coefficient $K^2$ will be described in detail.

Figure 74:
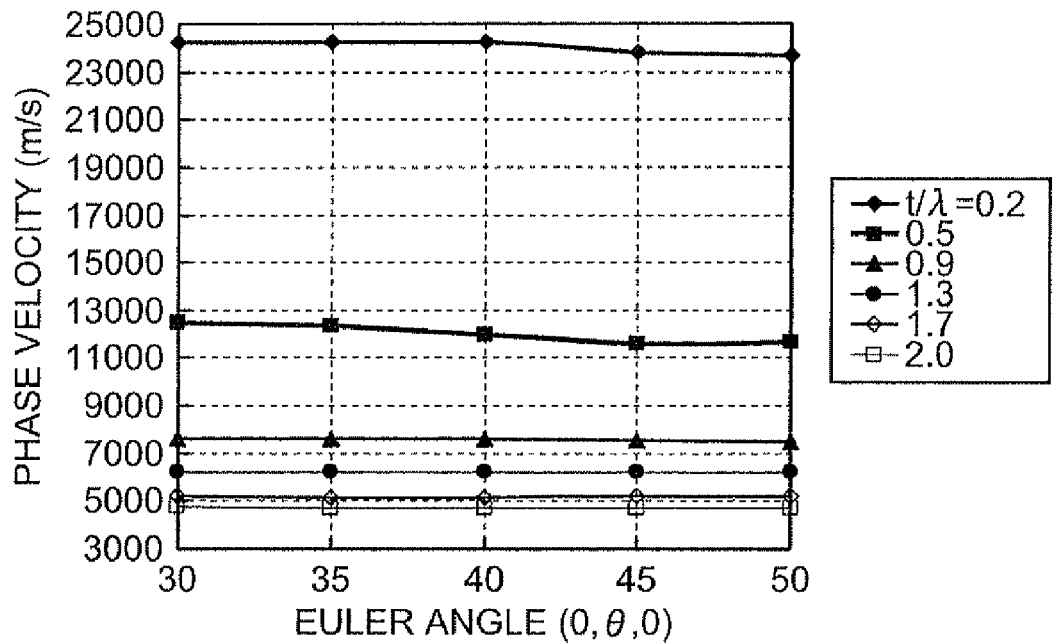
FIG. 74 is a graph showing a relation between the angle $\theta$ of Euler angle $(0, \theta, 0)$ and the phase velocity.

FIG. 74 is a graph showing a relation between the angle θ of the Euler angle (0, θ, 0) and the phase velocity. Here, the standardized substrate thickness t/λ is set to six levels in a range from 0.2 to 2.0 so as to indicate a phase velocity at each standardized substrate thickness t/λ.

As shown in FIG. 74, in all cases except for a case of the standardized substrate thickness t/λ=2.0, when the angle θ is in a range of 30 degrees to 50 degrees, a phase velocity of 5000 m/s or more is obtained.

Figure 75:
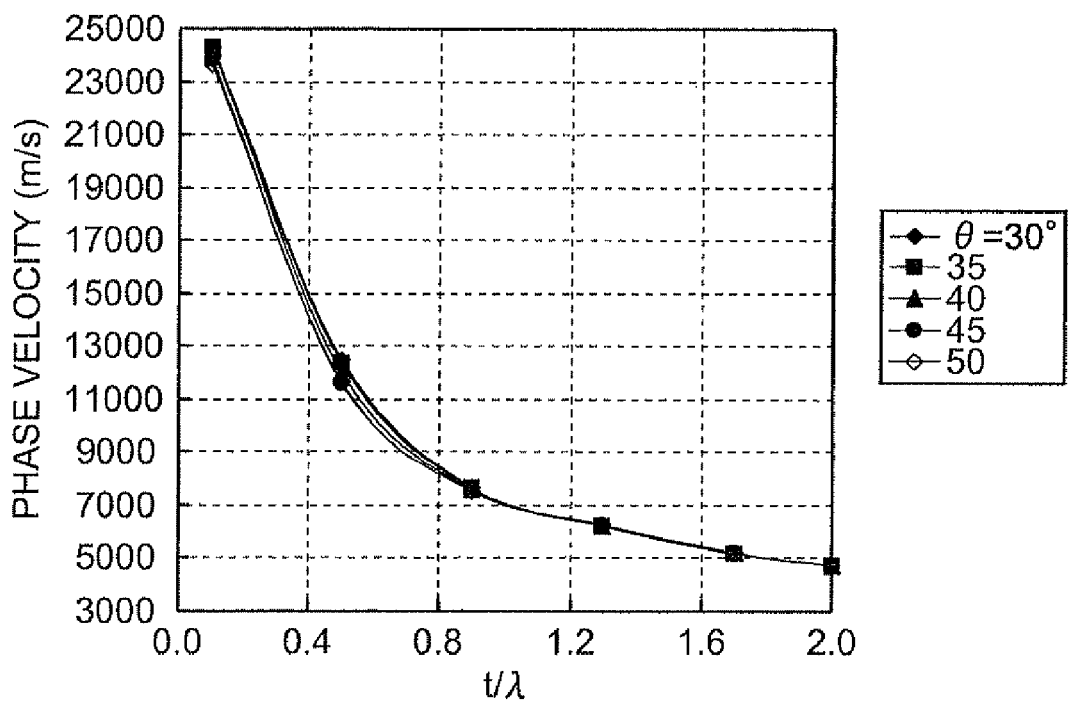
FIG. 75 is a graph showing a relation between the standardized substrate thickness $t/\lambda$ and the phase velocity.

FIG. 75 is a graph showing a relation between the standardized substrate thickness t/λ and the phase velocity. The angle θ in a case of the Euler angle (0, θ, 0) is set to five levels in a range from 30 degrees to 50 degrees so as to indicate a phase velocity at each angle θ.

As shown in FIG. 75, variation of the phase velocity at each angel θ is small. Further, in the most case in which the standardized substrate thickness t/λ is in the range from 0.2 to 2, a phase velocity of 5000 m/s or more is obtained.

Next, the mutual relation of the angle θ of the Euler angle (0, θ, 0), and the standardized substrate thickness t/λ with respect to the phase velocity, the frequency temperature variation, and the electromechanical coupling coefficient $K^2$ will be described.

Figure 76:
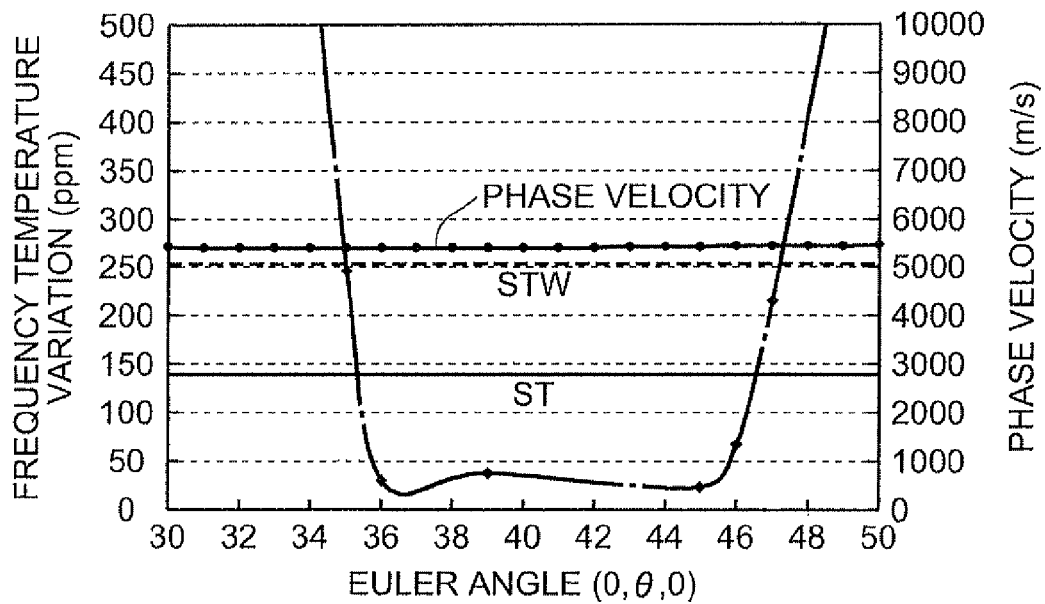
FIG. 76 is a graph showing a relation among the angle $\theta$ of Euler angle $(0, \theta, 0)$, the phase velocity, and the frequency temperature variation.

FIG. 76 is a graph showing a relation among the angle θ in the case of the Euler angle (0, θ, 0), the phase velocity, and the frequency temperature variation. Here, the standardized substrate thickness t/λ is 1.7.

As shown in FIG. 76, a range of the angle θ when the frequency temperature variation is smaller than that of STW cut quartz crystal is 35 degrees $\leq \theta \leq 47.2$ degrees (also refer to FIG. 73). FIG. 76 shows that the phase velocity of 5000 m/s or more is obtained in this range.

Figure 77:
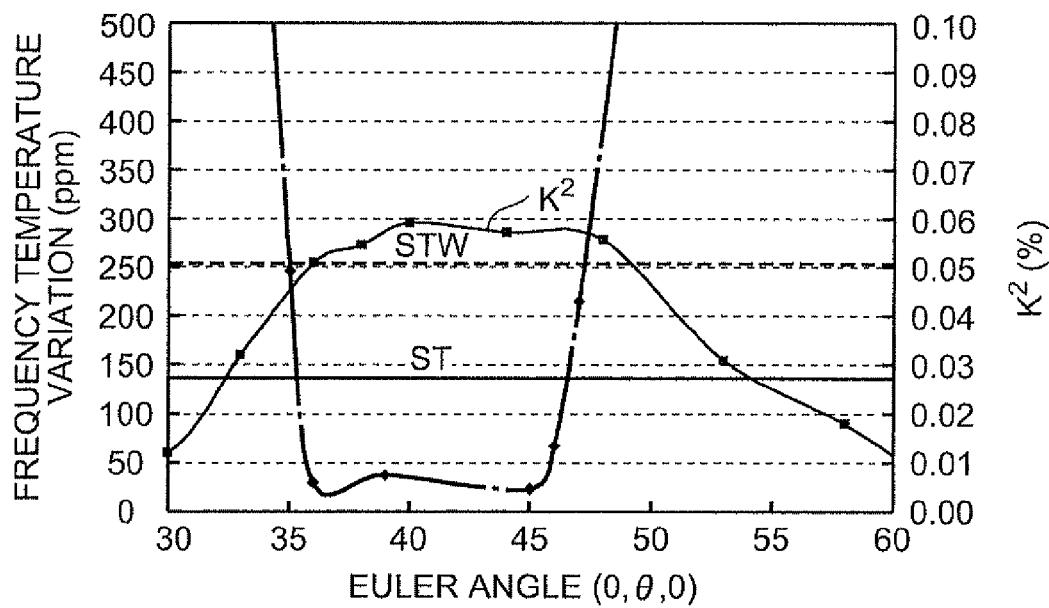
FIG. 77 is a graph showing a relation among the angle $\theta$ of Euler angle $(0, \theta, 0)$, an electromechanical coupling coefficient $K^2$, and the frequency temperature variation.

FIG. 77 is a graph showing a relation among the angle θ of the Euler angle (0, θ, 0), the electromechanical coupling coefficient $K^2$, and the frequency temperature variation. As shown in FIG. 77, a range of the angle θ of the Euler angle (0, θ, 0) when the frequency temperature variation is smaller than that of STW cut quartz crystal is 35 degrees $\leq \theta \leq 47.2$ degrees (also refer to FIG. 5).

In the range above, the electromechanical coupling coefficient $K^2$ largely exceeds a reference value of 0.02. When the range of the angle θ is 32.5 degrees $\leq \theta \leq 47.2$ degrees, the electromechanical coupling coefficient $K^2$ is 0.03 or more. When the range of the angle θ is 34.2 degrees $\leq \theta \leq 47.2$ degrees, the electromechanical coupling coefficient $K^2$ is 0.04 or more. Further, when the range of the angle θ is 36 degrees $\leq \theta \leq 47.2$ degrees, the electromechanical coupling coefficient $K^2$ is 0.05 or more.

Figure 78:
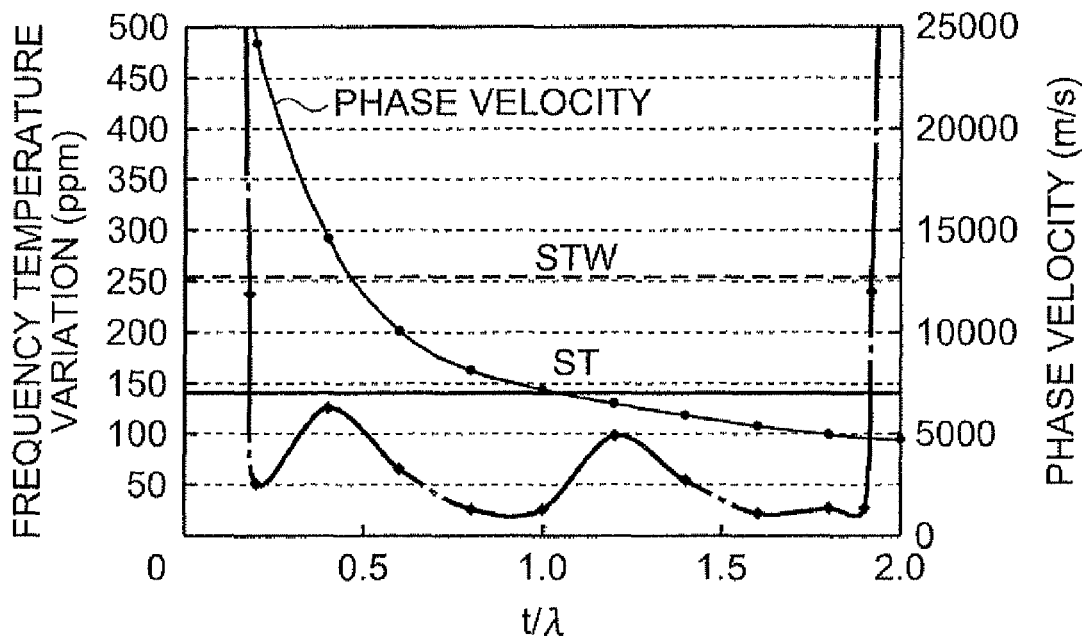
FIG. 78 is a graph showing a relation among the standardized substrate thickness $t/\lambda$, the phase velocity, and the frequency temperature variation.

FIG. 78 is a graph showing a relation among the standardized substrate thickness t/λ, the phase velocity, and the frequency temperature variation. As shown in FIG. 78, a range of t/λ when the frequency temperature variation is smaller than that of STW cut quartz crystal is $0.176 \leq t/\lambda \leq 1.925$ (also refer to FIG. 6). In most of this range, a phase velocity of 5000 m/s or more is obtained. In the range of the standardized substrate thickness t/λ, the smaller the standardized substrate thickness t/λ is, the faster the phase velocity is. A high frequency band becomes thus obtainable. That is, the phase velocity is adjustable by adjusting the standardized substrate thickness t/λ.

Figure 79:
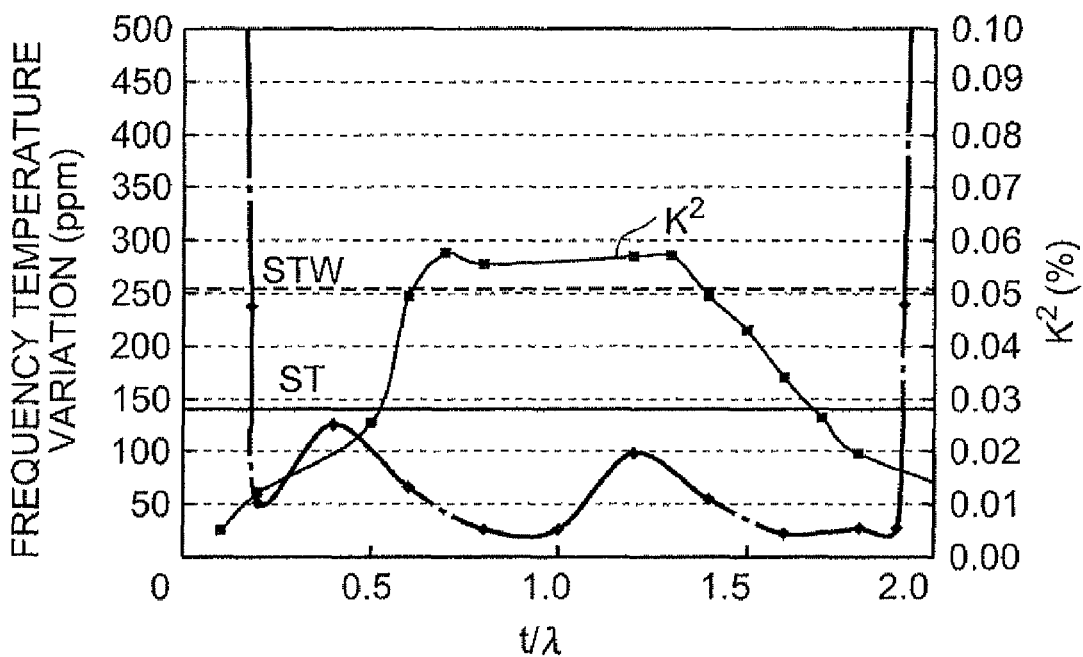
FIG. 79 is a graph showing a relation among the standardized substrate thickness $t/\lambda$, the electromechanical coupling coefficient $K^2$, and the frequency temperature variation.
Figure 80:
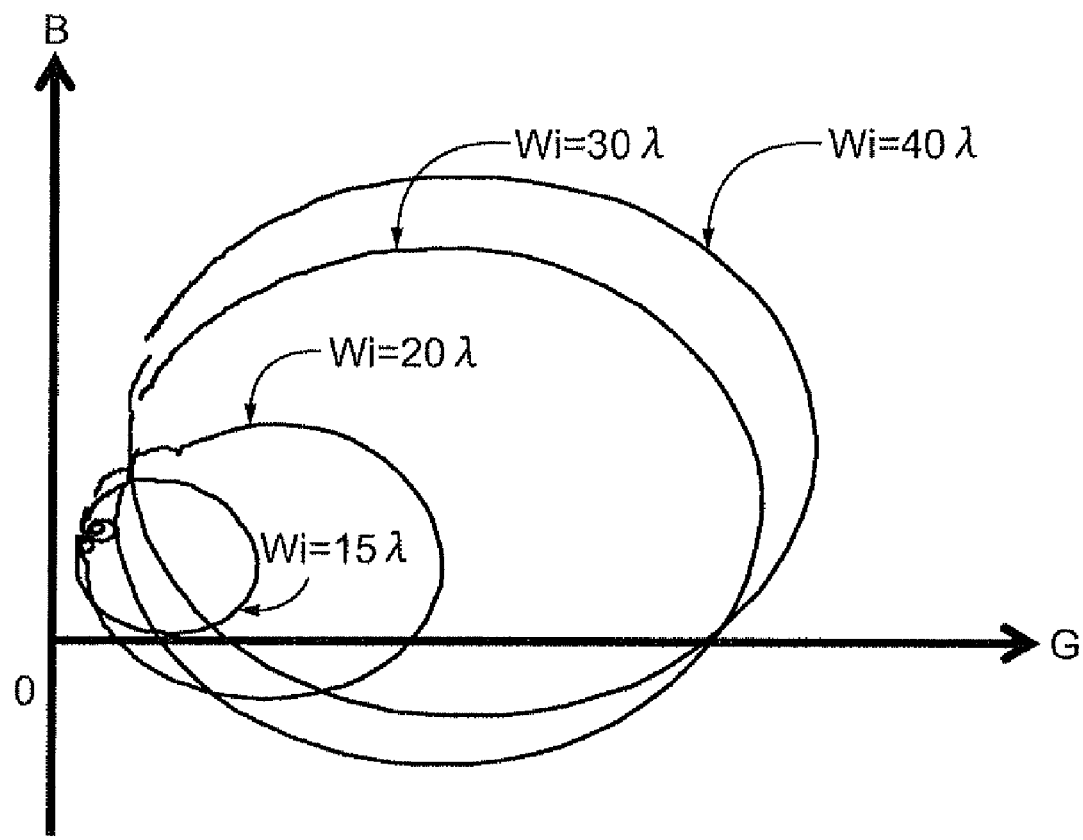
FIG. 80 is an admittance circle diagram in the vicinity of a resonance frequency.

FIG. 79 is a graph showing a relation among the standardized substrate thickness t/λ, the electromechanical coupling coefficient $K^2$, and the frequency temperature variation. As shown in FIG. 79, a range of the standardized substrate thickness t/λ when the frequency temperature variation is smaller than that of STW cut quartz crystal is $0.176 \leq t/\lambda \leq 1.925$ (also refer to FIGS. 6 and 11). In most of this range, the electromechanical coupling coefficient $K^2$ of 0.02 or more is obtained. In the range of the standardized substrate thickness t/λ that is close to 1, a region of a high value in which the electromechanical coupling coefficient $K^2$ is 0.05 or more is obtained.

In the second embodiment, the quartz substrate 10 is exemplified as a piezoelectric substrate, however, a piezoelectric material other than quartz crystal can be employed. For example, lithium tantalate, lithium niobate, lithium tetraborate, langasite, and potassium niobate can be employed. Further, a piezoelectric thin film made of zinc oxide, aluminum nitride, tantalum pentoxide or the like, a piezoelectric semiconductor made of cadmium sulfide, zinc sulfide, gallium arsenide, indium antimony or the like is also applicable.

However, a quartz substrate and other piezoelectric substrates have a big difference in resonance characteristics, particularly in temperature characteristics. Therefore, if a quartz substrate is employed as a piezoelectric substrate, frequency variation with respect to a temperature is suppressed to be smaller, and excellent frequency temperature characteristics can be obtained. Accordingly, when a quartz substrate is used as a piezoelectric substrate, and the optimum electrode design conditions described above are employed, providing a Lamb-wave resonator having excellent frequency temperature characteristics, and achieving a high Q value, and a low CI value.

Oscillator

Next, an oscillator will be described.

The oscillator includes the Lamb-wave resonator described above, and an oscillation circuit (not illustrated) for exciting the Lamb-wave resonator. Here, the Lamb-wave resonator in the range of the optimum electrode design conditions shown in FIG. 71 is employed. In each working example in the range of the optimum electrode design conditions, the cross width Wi of the electrode finger elements interdigitated to each other is from 20λ to 50λ. The Lamb-wave resonator in the optimum electrode design conditions as above can realize a high Q value, and a low CI value. However, in a case where the Lamb-wave resonator is employed to an oscillator, the Lamb-wave resonator satisfies oscillation conditions for a case where the Lamb-wave resonator is assembled with an oscillation circuit.

In order to oscillate the Lamb-wave resonator, the vicinity of a resonance frequency defined by the Lamb-wave resonator needs to be inductive. For making the vicinity of a resonance frequency inductive, the cross width Wi when the electrode finger elements are interdigitated to each other is influential.

FIG. 80 shows a measuring result of an admittance circle diagram in the vicinity of the resonance frequency. In FIG. 80, when Wi is 15λ or less, an admittance B is B>0 and capacitive, not providing oscillation.

On the other hand, when Wi is 20λ or more, the admittance B is B<0 and is inductive, enabling oscillation when the Lamb-wave resonator and the oscillation circuit are assembled.

Therefore, when the Lamb-wave resonator whose electrode finger elements are interdigitated to each other so that the cross width Wi of the electrode finger elements is 20λ or more is employed, an oscillator having excellent oscillation characteristics is achieved.

The Lamb-wave resonator described above is applicable to an edge reflection type resonator without the reflectors 25 and 26. Further, other than oscillators, the Lamb-wave resonator is applicable to filters, sensors, and the like.

The entire disclosure of Japanese Patent Application Nos: 2008-62234, filed Mar. 12, 2008 and 2008-286219, filed Nov. 7, 2008 are expressly incorporated by reference herein.

What is claimed is:

1. A Lamb-wave resonator, comprising:
a piezoelectric substrate being a quartz substrate;
an interdigital transducer electrode formed on a main surface of the piezoelectric substrate, the interdigital transducer electrode being formed of aluminum and including:
a plurality of electrode finger elements being interdigitated; and
a bus bar electrode coupling the plurality of electrode finger elements; and
a pair of reflectors disposed on opposite sides of the interdigital transducer electrode in a propagation direction of a Lamb wave, wherein a thickness t of the piezoelectric substrate is in a range expressed by $0<t/\lambda\leq3$ where a wavelength of the Lamb wave to be excited is represented as $\lambda$, a width of the piezoelectric substrate is greater than a cross width of the plurality of electrode finger elements that are interdigitated, the cross width of the plurality of electrode finger elements that are interdigitated is greater than or equal to 20λ and less than or equal to 50λ, and if a width of the bus bar electrode is Wb, a distance from the electrode finger elements to the bus bar electrode is Wg, in an orthogonal coordinate with an x axis indicating the distance Wg and a y axis indicating the width Wb, both the distance Wg and the width Wb are in one of a first range and a second range, wherein the first range is surrounded by a circular arc expressed by an equation of a circle $(x-10)^2+(y+12.7)^2=19^2$, and $Wg\geq1\lambda$ and $Wb\geq1\lambda$, and the second range is surrounded by a straight line connecting coordinates of (1.0, 7.0), (1.0, 20.0), (2.0, 21.0), (4.5, 22.5), (7.5, 25.0), (12.0, 23.0), (15.5, 20.8), (18.0, 14.0), (20.0, 7.0), (16.0, 10.0), (15.0, 9.0), (12.5, 8.0), (10.0, 8.0), (8.0, 9.0), (7.0, 8.0), (5.0, 8.0), (3.5, 10.0), (2.0, 10.0), (1.0, 7.0) in this order if the coordinates are represented as (Wg, Wb), wherein a unit of measure for Wg and Wb is λ.

2. The Lamb-wave resonator according to claim 1, wherein the piezoelectric substrate has an Euler angle ($\phi, \theta, \psi$) satisfying $\phi=0$ degrees, 35 degrees$\leq\theta\leq$47.2 degrees, and $-5$ degrees$<\psi<+5$ degrees, and a relation between the thickness t and the wavelength λ of the Lamb wave satisfies $0.176\leq t/\lambda\leq1.925$.

3. An oscillator, comprising:
1. b-wave resonator according to claim 1; and
an oscillation circuit for exciting the Lamb-wave resonator.

* * * * *